United States Patent
Yamashita et al.

(10) Patent No.: US 9,522,998 B2
(45) Date of Patent: Dec. 20, 2016

(54) RESIN MOLD MATERIAL COMPOSITION FOR IMPRINTING

(71) Applicant: DAIKIN INDUSTRIES, LTD., Osaka-shi, Osaka (JP)

(72) Inventors: Tsuneo Yamashita, Settsu (JP); Masamichi Morita, Settsu (JP); Yoshiko Kuwajima, Settsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 50 days.

(21) Appl. No.: 14/391,064

(22) PCT Filed: Apr. 9, 2013

(86) PCT No.: PCT/JP2013/060749
§ 371 (c)(1),
(2) Date: Oct. 7, 2014

(87) PCT Pub. No.: WO2013/154112
PCT Pub. Date: Oct. 17, 2013

(65) Prior Publication Data
US 2015/0064909 A1 Mar. 5, 2015

(30) Foreign Application Priority Data

Apr. 10, 2012 (JP) ................................ 2012-089123

(51) Int. Cl.
| | | |
|---|---|---|
| *C09K 13/06* | (2006.01) |
| *C08L 33/16* | (2006.01) |
| *B29C 33/40* | (2006.01) |
| *G03F 7/00* | (2006.01) |
| *B29C 33/38* | (2006.01) |
| *B29C 33/42* | (2006.01) |
| *B29C 43/00* | (2006.01) |
| *B29C 43/02* | (2006.01) |
| *B29C 43/50* | (2006.01) |
| *B29C 71/04* | (2006.01) |
| *C08L 37/00* | (2006.01) |
| *H01L 21/308* | (2006.01) |
| *B29K 33/00* | (2006.01) |
| *B29K 105/00* | (2006.01) |
| *B29K 105/24* | (2006.01) |
| *B29L 31/00* | (2006.01) |
| *C08G 77/14* | (2006.01) |
| *C08G 77/20* | (2006.01) |

(52) U.S. Cl.
CPC ............ *C08L 33/16* (2013.01); *B29C 33/3857* (2013.01); *B29C 33/40* (2013.01); *B29C 33/424* (2013.01); *B29C 43/003* (2013.01); *B29C 43/02* (2013.01); *B29C 43/50* (2013.01); *B29C 71/04* (2013.01); *C08L 37/00* (2013.01); *G03F 7/0002* (2013.01); *H01L 21/3081* (2013.01); *H01L 21/3086* (2013.01); *B29C 2043/025* (2013.01); *B29K 2033/12* (2013.01); *B29K 2105/0014* (2013.01); *B29K 2105/0085* (2013.01); *B29K 2105/0088* (2013.01); *B29K 2105/24* (2013.01); *B29L 2031/757* (2013.01); *C08G 77/14* (2013.01); *C08G 77/20* (2013.01); *C08L 2205/06* (2013.01); *C08L 2312/06* (2013.01)

(58) Field of Classification Search
CPC .............. C08F 220/24; C08F 2220/325; C08F 2220/1875; B29C 33/40; B29C 33/424; H01L 21/31144; H01L 21/3081; H01L 21/308
USPC ... 252/79.1, 79.2, 79.3, 79.4; 430/80, 119.1, 430/119.2; 438/717, 725, 736
See application file for complete search history.

(56) References Cited

U.S. PATENT DOCUMENTS

| | | | | |
|---|---|---|---|---|
| 7,205,086 B2* | 4/2007 | Berger | ................ | G03F 7/0046 430/270.1 |
| 8,980,404 B2* | 3/2015 | Kodama | ................ | B82Y 10/00 264/293 |
| 2002/0127499 A1 | 9/2002 | Endo et al. | | |

(Continued)

FOREIGN PATENT DOCUMENTS

| | | |
|---|---|---|
| JP | 2002-270541 A | 9/2002 |
| JP | 2008-6819 A | 1/2008 |

(Continued)

OTHER PUBLICATIONS

International Preliminary Report on Patentability dated Oct. 23, 2014 from the International Searching Authority in counterpart application No. PCT/JP2013/060749.

(Continued)

*Primary Examiner* — Lan Vinh
(74) *Attorney, Agent, or Firm* — Sughrue Mion, PLLC

(57) ABSTRACT

Provided are: a resin mold material and a resin replica mold material composition for imprinting having a superior mold releasability; a resin mold and a resin replica mold resulting from containing the material composition; and a method for producing them. The resin mold material or resin replica mold material composition for imprinting contains 100 parts by weight of a mold resin or replica mold resin for imprinting and 0.1 to 10 parts by weight of a curable fluoropolymer (A). Preferably, the fluoropolymer (A) has a weight-average molecular weight of 3,000 to 20,000 and results from including as repeating units (a1) an α-position substituted acrylate having a fluoroalkyl group having 4 to 6 carbon atoms and (a2) and 5 to 120 parts by weight of a high-softening-point monomer exhibiting a glass transition point or softening point of at least 50° C. in the homopolymer state.

30 Claims, No Drawings

(56) References Cited

U.S. PATENT DOCUMENTS

| | | | |
|---|---|---|---|
| 2004/0038151 A1* | 2/2004 | Berger | G03F 7/0046 430/271.1 |
| 2004/0211755 A1 | 10/2004 | Yusa et al. | |
| 2008/0000877 A1 | 1/2008 | Kim | |
| 2008/0027154 A1* | 1/2008 | Ramsey | A01N 59/14 522/7 |
| 2010/0063222 A1* | 3/2010 | Oikawa | C08F 283/12 525/474 |
| 2010/0092727 A1 | 4/2010 | Uchida | |
| 2010/0093951 A1 | 4/2010 | Oikawa et al. | |
| 2011/0020617 A1 | 1/2011 | Kawaguchi | |
| 2012/0175821 A1* | 7/2012 | Kawaguchi | B82Y 10/00 264/447 |
| 2013/0032971 A1 | 2/2013 | Omatsu et al. | |
| 2013/0049255 A1 | 2/2013 | Matsumoto et al. | |

FOREIGN PATENT DOCUMENTS

| | | |
|---|---|---|
| JP | 4111997 B1 | 7/2008 |
| JP | 2009-184275 A | 8/2009 |
| JP | 2009-227937 A | 10/2009 |
| JP | 2010-45092 A | 2/2010 |
| JP | 2010-49745 A | 3/2010 |
| JP | 2010-206189 A | 9/2010 |
| JP | 2011-222732 A | 11/2011 |
| KR | 1020090100353 A | 9/2009 |
| KR | 1020110015304 A | 2/2011 |
| KR | 1020110021727 A | 3/2011 |
| WO | 2011/111741 A1 | 9/2011 |

OTHER PUBLICATIONS

International Search Report for PCT/JP2013/060749 dated Jun. 4, 2013.

\* cited by examiner

RESIN MOLD MATERIAL COMPOSITION FOR IMPRINTING

CROSS REFERENCE TO RELATED APPLICATIONS

This application is a National Stage of International Application No. PCT/JP2013/060749 filed Apr. 9, 2013, claiming priority based on Japanese Patent Application No. 2012-089123 filed Apr. 10, 2012, the contents of all of which are incorporated herein by reference in their entirety.

TECHNICAL FIELD

The present invention relates to a resin mold material composition for imprinting. Further, the present invention relates to a resin molding material composition for imprinting providing a superior mold releasability. The "resin mold material" referred to in the present invention includes a "resin replica mold material".

BACKGROUND ART

Advancement of IT technology in recent years is supported by advances in miniaturization technology. Among them, mold imprinting is expected as a technique which is able to respond to the demands of mass production and fine miniaturization without using expensive equipment such as a projection exposure apparatus in the fields of photolithography or electron beam lithography.

Mold imprinting (hereinafter, referred to as "mold imprinting" or "imprinting") is conducted by pressing a mold formed with a convexo-concave fine pattern on its surface against a resin (resist) layer which is curable by electromagnetic radiation such as UV on a substrate of silicon, quartz, or resin to transfer the fine structure, and exposing it to radiation such as UV light to cure the resin layer, and thereby immobilizing the transferred fine structure. The resin layer is used as a molded article, and as it is. Furthermore, after releasing the mold, the transfer film layer is subjected to asking treatment by oxygen plasma, and to etching treatment, so that a silicon semiconductor substrate formed with the fine structure of the pattern can be obtained.

The mold that has been released is used repeatedly. In addition, in order not to damage the fine structure pattern of the transfer layer during the release, and in order to improve (shorten) the industrial production cycle, a high mold releasability of the transfer layer from the mold is required. For improving the mold releasability, in general, a silicone-based mold release agent, a fluorine-based coupling agent or the like is applied to the surface of the mold.

On the other hand, as the original mold block (also referred to as a "mother mold" or a "master mold"), the original mold block made of silicon or quartz is generally used, but it is very expensive. Therefore, a mold made of resin ("resin mold") in place of silicon or quartz, and a replica made of resin ("resin replica mold") which is a copy of the quartz mold has been developed.

Herein, the resin replica mold means a replica obtained by pressing the original mold block made of quartz (mother mold) against the resin surface and having a fine structure which is transferred in inverse from the convexoconcave of the mother mold ("mother pattern"). This replica is used as a mold ("resin replica mold") for transfer onto the other resin surface, thereby a mold having a fine structure of the same convexo-concave pattern as the mother pattern ("resin mold") can be obtained.

In other words, the relationship is as follows: (a) the original mold block of silicon or quartz (mother pattern) produces the resin replica mold (the inverted convexo-concave pattern structure with respect to the mother pattern), and (b) the resin replica mold (the inverted convexo-concave pattern) produces the resin mold (the same convexo-concave pattern as the mother pattern). Thus obtained resin mold is used as an mold for imprinting to establish the industrial process which is economically advantageous.

In the manufacturing step of the resin replica mold and the resin mold as above, a mold releasability is considered. That is, in order not to damage the fine structure pattern of the transfer layer during release, and in order to improve (shorten) the industrial production cycle, a high mold releasability of the transfer layer from the mold is required. For improving the mold releasability, a method of forming a mold release-promoting layer of a silicone-based mold release agent, a fluorine-based coupling agent or the like on the surface of the mold is conventionally known. It is illustrated below:

(1) JP 2002-270541 A discloses a mold for imprinting having a surface treatment layer containing a silyl chloride compound having a fluorine-containing group.

(2) JP 4,111,997 B discloses a method for imprinting wherein a mold is pressed against a resin coating which silicone oil or a fluorine-containing water-repellent agent permeates.

(3) JP 2009-184275 A discloses a method of interposing a mold release agent between a mold and a resin layer to be imprinted.

(4) JP 2010-045092 A discloses a method of applying a mold release agent onto a resist layer before a mold is pressed.

(5) JP 2010-049745 A discloses a patterned layer on which a release coating made of a fluorine-containing compound is formed.

However, according to these methods of applying a mold release agent or the like to form the release coating, when the mold is used for imprinting, durability of the mold is insufficient, and for mass production of the article to which the pattern is transferred cleaning of the mold and retreatment of the release coating are required depending on degradation of the mold releasability. Further improvements are awaited as an industrial production process.

On the other hand, a method for making the resin molding itself with a superior mold releasability is also proposed. For example, (5) JP 2010-049745 A discloses a method of using a fluorine-containing resin for the convexo-concave fine patterned layer is disclosed. For example, in Example 5 of this publication, the patterned layer is prepared by using NIF-A-1 (produced from Asahi Glass Co., Ltd.) which is a fluorine-containing resin. In this case, the publication says that because of improvement in the mold releasability, occurrence of defects in the mold is prevented even if the number of imprinting exceeds 5,000 times, so that the time period for replacement of the mold in mass production can be extended. However, such invention results in high cost because the patterned layer is prepared from the expensive fluorine-containing resin only, so that further improvement is awaited.

CITATION LIST

Patent Literature

Patent Literature 1: JP 2002-270541 A
Patent Literature 2 JP 4111997 B

Patent Literature 3: JP 2009-184275 A
Patent Literature 4: JP 2010-045092 A
Patent Literature 5: JP 2010-049745 A

SUMMARY OF INVENTION

Technical Problem

The object of the present invention is to provide a resin mold material and a resin replica mold material composition for imprinting having a superior mold releasability, and provide a resin mold and resin replica mold containing the material composition and a process for manufacturing them. A further object of the present invention is to provide a resin mold material and a resin replica mold material composition for imprinting having advantage in cost, in addition to a superior mold releasability.

Solution to Problem

That is, the present invention provides a resin mold material composition for imprinting which comprises 0.1 to 10 parts by weight of a curable fluoropolymer (or fluorine-containing polymer) (A) with respect to 100 parts by weight of a curable resin or curable monomer which is able to form a mold resin or a replica mold resin for imprinting. The "resin mold material" referred to in the present invention includes a "resin replica mold material" (which is also applied hereinafter).

In a preferred embodiment, the present invention provides a resin mold material composition for imprinting which comprises which comprises 0.1 to 10 parts by weight of a photothermal-curable fluoropolymer (or fluorine-containing polymer) (A) with respect to 100 parts by weight of a photothermal-curable resin or photothermal-curable monomer which is able to form a mold resin or a replica mold resin for imprinting.

Advantageous Effects of Invention

The resin mold material composition for imprinting of the present invention provides a superior mold release even though a content of the expensive fluoropolymer is small, the resin replica mold and the resin mold obtained by using this composition contributes to speeding up of imprinting process without causing damage of the mold itself and damage of the fine structure pattern, and is able to increase the number of repetitive use of the mold.

DESCRIPTION OF EMBODIMENTS

One of components as the major feature in the resin mold material (hereinafter, containing a resin replica mold material) composition for imprinting of the present invention is a curable fluoropolymer (A). The curable, preferably photo-curable fluoropolymer (A) used in the present invention provides a superior mold releasability with the additive amount of 10 parts by weight or less, so that it is advantageous in terms of cost. The reason why it exerts the effect with such a small amount is presumably that the fluoropolymer (A) forms a uneven distribution of its concentration in the resin composition, and the fluoropolymer (A) is distributed more on or near the surface of the material composition before curing, but the present invention is not bound by the mechanism.

The present invention also provides a material composition, wherein the curable fluoropolymer (A) comprises as a repeating unit:

(a1) an α-position substituted acrylate having a fluoroalkyl group with a carbon number (carbon atoms) of 4 to 6
wherein a substituent group at the α-position is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20; and the curable fluoropolymer (A) has a weight-average molecular weight of 3,000 to 20,000.

The present invention also provides a material composition, wherein the curable fluoropolymer (A) corresponds to a fluoropolymer (A1) which comprises as repeating units:

(a1) an α-position substituted acrylate having a fluoroalkyl group with a carbon number of 4 to 6 at 100 parts by weight
wherein a substituent group at the α-position is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20, and (a2) a high-softening-point monomer which exhibits a softening point or glass transition point of at least 50° C. in a state of homopolymer, at 5 to 120 parts by weight; and the fluoropolymer (A1) has a weight-average molecular weight of 3,000 to 20,000.

The high-softening-point monomer (a2) may be a cyclic hydrocarbon group-containing (meth) acrylate and/or an SiO-containing monomer (a4).

The SiO-containing monomer (a4) may be a silicone (meth) acrylate and/or an alkoxysilane group-containing (meth) acrylate.

The fluoropolymer (A1) in the present invention may further comprise as a repeating unit:

(a3) a crosslinking group-containing monomer containing one or both of an epoxy group (a3-1) and a hydroxyl group (a3-2), at 5 to 30 parts by weight. The epoxy group (a3-1) of the fluoropolymer (A1) may be reacted with an unsaturated organic acid, and/or the hydroxyl group (a3-2) of the fluoropolymer (A1) may be reacted with an isocyanate group-containing unsaturated compound.

The fluoropolymer (A1) in the present invention may further comprise as repeating units:

(a3-1) a crosslinking group-containing monomer containing an epoxy group at 5 to 30 parts by weight, and (a4) an SiO-containing monomer at 2 to 20 parts by weight.

The present invention also provides a resin mold material or a resin replica mold material composition for imprinting, wherein the composition comprises a fluoropolymer (A2) which comprises as repeating units:

(a1) an α-position substituted acrylate having a fluoroalkyl group with a carbon number of 4 to 6, at 100 parts by weight
wherein a substituent group at the α-position is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20, (a3-1) a crosslinking group-containing monomer containing an epoxy group at 5 to 60 parts by weight, and (a5) an alkyleneoxy group-containing monomer represented by a formula $(R^1O)_nR^2$ (wherein $R^1$ is —$(CH_2)_2$— or —$(CH_2)_3$—, $R^2$ is hydrogen or a methyl group, and n is 1 to 10) at 10 to 40 parts by weight; and the fluoropolymer (A2) has a weight-average molecular weight of 3,000 to 20,000; and the content of the fluoropolymer (A2) is in a range from 0.1 to 10 parts by weight.

The present invention also provides a resin mold material or a resin replica mold material composition for imprinting, wherein the composition comprises a fluoropolymer (A2)' which comprises as repeating units:

(a1) an α-position substituted acrylate having a fluoroalkyl group with a carbon number of 4 to 6, at 100 parts by weight wherein a substituent group at the α-position is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20, (a5) an alkyleneoxy group-containing monomer represented by a formula $(R^1O)_nR^2$ (wherein $R^1$ is —$(CH_2)_2$— or —$(CH_2)_3$—, $R^2$ is hydrogen or a methyl group, and n is 1 to 10) at 55 to 300 parts by weight, and if present, (a2) a high-softening-point monomer which exhibits a softening point or glass transition point of at least 50° C. in a state of homopolymer, at 5 to 120 parts by weight; and the fluoropolymer (A2)' has a weight-average molecular weight of 3,000 to 20,000; and the content of the fluoropolymer (A2)' is in a range from 0.1 to 10 parts by weight.

The fluoropolymer (A2) or (A2)' may further comprise as a repeating unit (a4) an SiO-containing monomer at 2 to 20 parts by weight. Further, a hydroxyl group at the terminal of the alkyleneoxy group-containing monomer (a5) of the fluoropolymer (A2) or (A2)' may be reacted with an isocyanate group-containing unsaturated compound.

The present invention also provides a manufacturing process for a resin mold and a resin replica mold characterized by using the above described material composition, and a resin mold and a resin replica mold produced by the manufacturing process, and further provides a manufacturing process for a molded resin article having a fine structure of a repeated pattern characterized by using the above described resin mold and resin replica mold.

<Curable Fluoropolymer>

A curable, preferably photo-curable fluoropolymer (A) used in a resin mold material and a resin replica mold material composition for imprinting of the present invention, is not particularly limited as long as the fluoropolymer has a functional group which is able to cause a crosslinking reaction by a radical or an acid (proton) generated from a photo or thermal initiator. For example, as the functional group reactive with a radical, an acryloyl group, a methacryloyl group, a vinyl group, and an allyl group, each of which α-position may be substituted with a halogen (Cl, F, etc.), can be used; and as the functional group reactive with an acid, an epoxy group, an oxetane group, a vinyl group, an allyl group, a silyl group, a siloxane group and the like can be used. These functional groups may be polymerized with a fluorine-containing monomer (e.g. (meth) acrylate glycidyl perfluorobutyl) or may be copolymerized with fluorine-containing monomer as a comonomer (e.g. glycidyl methacrylate) of the fluorine-containing monomer.

As the photo-curable fluoropolymer (A), a fluoropolymer having a functional group which is able to cause a crosslinking reaction by a radical or an acid generated from a photo initiator.

Monomers used for preparing the fluoropolymer are described below.

A curable fluoropolymer (A1) used in a resin mold material and a resin replica mold material composition for imprinting of the present invention comprises as repeating units:

an α-substituted acrylate monomer having a fluoroalkyl group with a carbon number of 4 to 6 (a1), and a high-softening-point monomer which exhibits a glass transition point or softening point of at least 50° C. in a state of homopolymer (a2).

The substituent group at the α-position in the α-substituted acrylate for the monomer component (a1) may be a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20.

A composition ratio of the components (a1) and (a2) in the fluoropolymer (A1) may be the α-position substituted acrylate (a1) at 100 parts by weight, and the high-softening-point monomer (a2) at 5 to 120 parts by weight, preferably 20 to 100 parts by weight, and more preferably 20 to 50 parts by weight.

The fluoropolymer (A1) may further comprise a crosslinking group-containing monomer (a3) containing one or both of an epoxy group (a3-1) and a hydroxyl group (a3-2). A compositional ratio of the monomers (a1), (a2) and (a3) may be the α-position substituted acrylate (a1) at 100 parts by weight, the high-softening-point monomer (a2) at 5 to 120 parts by weight, preferably 20 to 100 parts by weight, and more preferably 20 to 50 parts by weight, and the crosslinking group-containing monomer (a3) at 5 to 30 parts by weight, preferably 8 to 25 parts by weight, and more preferably 10 to 20 parts by weight.

The epoxy group (a3-1) of the crosslinking group-containing monomer (a3) may be reacted with an unsaturated organic acid. And, the hydroxyl group (a3-2) may be reacted with an isocyanate group-containing unsaturated compound.

One other fluoropolymer (A2) used in the present invention comprises as repeating units, an α-position substituted acrylate (a1), a crosslinking group-containing monomer containing an epoxy group (a3-1), and an alkyleneoxy group-containing monomer (a5) represented by the formula $(R^1O)_nR^2$ wherein $R^1$ is —$(CH_2)_2$— or —$(CH_2)_3$—, $R^2$ is hydrogen or a methyl group, and n is 1 to 10) at 10 to 40 parts by weight. The monomer component (a1) may comprise the α-substituted acrylate having a fluoroalkyl group with a carbon number of 4 to 6 as described in the above.

A compositional ratio of the constituent components (a1), (a3-1) and (a5) of the fluoropolymer (A2) may be
the α-position substituted acrylate (a1) at 100 parts by weight,
the crosslinking group-containing monomer containing an epoxy group (a3-1) at 5 to 60 parts by weight, preferably 10 to 50 parts by weight, and more preferably 20 to 40 parts by weight, and
the alkyleneoxy group-containing monomer (a5) at 10 to 40 parts by weight, and preferably 20 to 30 parts by weight.

One other fluoropolymer (A2)' used in the present invention comprises as repeating units, an α-position substituted acrylate (a1) and an alkyleneoxy group-containing monomer (a5), and may or may not comprises as a repeating unit a high-softening-point monomer (a2). The monomer component (a1) may comprise the α-substituted acrylate having a fluoroalkyl group with a carbon number of 4 to 6 as described in the above.

A compositional ratio of the constituent components (a1) and (a5), and (a2) if present, of the fluoropolymer (A2)' may be
the α-position substituted acrylate (a1) at 100 parts by weight,
the alkyleneoxy group-containing monomer (a5) at 55 to 300 parts by weight, preferably 70 to 250 parts by weight, and more preferably 100 to 200 parts by weight, and
if present, the high-softening-point monomer (a2) at 5 to 120 parts by weight, preferably 20 to 100 parts by weight, and more preferably 20 to 50 parts by weight.

The fluoropolymer (A2) and the fluoropolymer (A2)' may further comprise as a repeating unit an SiO-containing monomer (a4), in addition to the above monomers (a1), (a3-1) and (a5) for the fluoropolymer (A2), and in addition to the above monomers (a1) and (a5), and (a2) if present for the fluoropolymer (A2)'.

The content ratio of the monomer (a4) may be 2 to 20 parts by weight, preferably 4 to 16 parts by weight, and more preferably 8 to 12 parts by weight with respect to 100 parts by weight of the α-position substituted acrylate (a1).

A hydroxyl group at the terminal of the alkyleneoxy group-containing monomer (a5) may be reacted with an isocyanate group-containing unsaturated compound.

The α-position substituted acrylate (a1) is preferably at 15 to 70 parts by weight, more preferably 25 to 65 parts by weight, exemplarily 40 to 60 parts by weight with respect to 100 parts by weight of the fluoropolymer (A).

In the fluoropolymer (A), specifically in the fluoropolymers (A1) and (A2) or (A2)', the fluorine concentration may be 15 to 35% by weight, preferably 20 to 35% by weight, and more preferably 25 to 30% by weight, and its weight-average molecular weight may be 3,000 to 20,000, and preferably 5,000 to 15,000.

Regarding the fluoropolymer (A), specifically the fluoropolymers (A1) and (A2) or (A2)', it is possible to reduce the lower limit of the fluorine concentration to 15% by weight. By increasing the amount of the crosslinking group-containing monomer (a3) containing an epoxy group (a3-1) and/or a hydroxyl group (a3-2) while reducing the α-position substituted acrylate (a1), the fluoropolymer can be improved in (i) a compatibility in the resin mold or resin replica mold material composition and (ii) a crosslinking property with other raw material. In a preferred embodiment, the fluorine concentration in the fluoropolymer (A), (A1) and (A2) or (A2)' may be 15 to 35% by weight, preferably 17 to 30% by weight, and more preferably 18 to 27% by weight.

When the α-position substituted acrylate (a1) constituting the fluoropolymer (A), specifically (A1) and (A2) or (A2)' is in a range from 15 to 70% by weight and the fluorine concentration in the fluoropolymer (A) is in a range from 15 to 35% by weight, this brings about a high liquid repellency and mold releasability and a good compatibility with other components constituting the resin mold material and the resin replica mold material composition. When the high-softening-point monomer (a2) constituting the fluoropolymer (A) is in a range from 5 to 120 parts by weight with respect to 100 parts by weight of the α-position substituted acrylate (a1), this brings about excellence in the effect of dimensional stability, and also a good liquid repellency and mold releasability. When the weight-average molecular weight of the fluoropolymer (A), specifically (A1) and (A2) or (A2)' is in a range from 3,000 to 20,000, the surface segregation of the fluoropolymer (A) in the resin mold and resin replica mold material composition is good, so that a small amount thereof can provide the sufficient liquid repellency and mold releasability.

It is more preferable to make the fluoropolymer (A) copolymerized with a crosslinking group-containing monomer (a3), for example, a crosslinking group-containing monomer containing an epoxy group (a3-1) and/or a hydroxyl group (a3-2), specifically an epoxy group-containing monomer (a3-1) or a hydroxyl group-containing monomer (a3-2). In a case of using an epoxy group-containing monomer (a3-1), a carboxylic acid group-containing (meth) acrylate may be reacted further with the epoxy group(s) in the polymer. In a case of using a hydroxyl group-containing monomer (a3-2), an isocyanate group-containing (meth) acrylate may be reacted further with the hydroxyl group(s) in the polymer.

The fluoropolymer (A), specifically (A1) and (A2) or (A2)' may be any of random, alternating, block and graft copolymers.

The α-position substituted acrylate (a1) is preferably expressed by the formula:

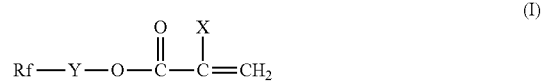

(I)

Wherein X is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 21 (e.g. 1 to 20), a substituted or unsubstituted benzyl group, a substituted or unsubstituted phenyl group, or a linear or branched alkyl group with a carbon number of 1 to 20;

Y is a direct bond, an aliphatic group with a carbon number of 1 to 10 which may have an oxygen atom(s), an aromatic group, a cyclic aliphatic group or an aromatic aliphatic group with a carbon number of 6 to 10 which may have an oxygen atom(s), $-CH_2CH_2N(R^1)SO_2-$ group (wherein $R^1$ is an alkyl group with a carbon number of 1 to 4), $-CH_2CH(OY^1)CH_2-$ group (wherein $Y^1$ is a hydrogen atom or an acetyl group), or $-(CH_2)_nSO_2-$ group (wherein n is from 1 to 10); and Rf is a linear or branched fluoroalkyl group with a carbon number of 4 to 6.

It is preferable that Rf is a perfluoroalkyl group with a carbon number of 4 to 6, especially a perfluoroalkyl group with a carbon number of 4.

Examples of the α-position substituted acrylate (a1) are as follows.

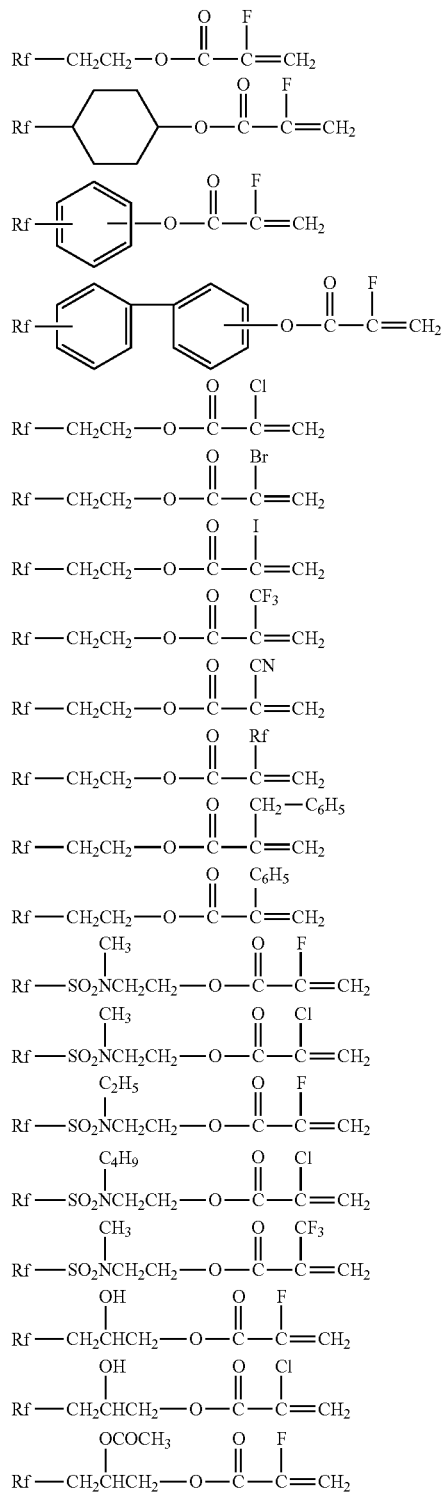

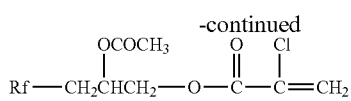

$CH_2=C(-F)-C(=O)-O-(CH_2)_2-S-Rf$ $CH_2=C(-F)-C(=O)-O-(CH_2)_2-S-(CH_2)_2-Rf$ $CH_2=C(-F)-C(=O)-O-(CH_2)_2-SO_2-Rf$ $CH_2=C(-F)-C(=O)-O-(CH_2)_2-SO_2-(CH_2)_2-Rf$ $CH_2=C(-F)-C(=O)-NH-(CH_2)_2-Rf$ $CH_2=C(-Cl)-C(=O)-O-(CH_2)_2-S-Rf$ $CH_2=C(-Cl)-C(=O)-O-(CH_2)_2-S-(CH_2)_2-Rf$ $CH_2=C(-Cl)-C(=O)-O-(CH_2)_2-SO_2-Rf$ $CH_2=C(-Cl)-C(=O)-O-(CH_2)_2-SO_2-(CH_2)_2-Rf$ $CH_2=C(-Cl)-C(=O)-NH-(CH_2)_2-Rf$ $CH_2=C(-Cl)-C(=O)-O-(CH_2)_3-S-Rf$ $CH_2=C(-Cl)-C(=O)-O-(CH_2)_3-SO_2-Rf$ $CH_2=C(-CH_3)-C(=O)-O-(CH_2)_2-Rf$

In these formulae, Rf is a linear or branched fluoroalkyl group with a carbon number of 4 to 6.

The high-softening-point monomer (a2) generally may be a monomer exhibiting a glass transition point or melting point of at least 50° C., preferably at least 100° C., and more preferably at least 120° C. in a state of homopolymer.

The high-softening-point monomer (a2) is preferably $CH_2=C(R^1)COOR^2$ wherein $R^1$ is H or $CH_3$, $R^2$ is a saturated alkyl group with a carbon number of 4 to 20 and a ratio of carbon atoms to hydrogen atoms of 0.58 or more. $R^2$ may be a cyclic hydrocarbon (the number of carbon atoms of 5 to 20). Examples of $R^2$ include a bridged hydrocarbon ring such as isobornyl, bornyl, fencyl (all of them is $C_{10}H_{17}$; carbon atoms/hydrogen atoms=0.58), adamantyl ($C_{10}H_{15}$; carbon atoms/hydrogen atom=0.66), norbornyl ($C_3H_{12}$; carbon atoms/hydrogen atoms=0.58), and the like. Such bridged hydrocarbon ring may have an alkyl group or hydroxyl group (carbon number of, for example, 1 to 5).

Examples of the high-softening-point monomer (a2) may include methyl methacrylate, phenyl methacrylate, cyclohexyl methacrylate, isobornyl (meth) acrylate, benzyl (meth) acrylate, norbornyl (meth) acrylate, and adamantyl (meth) acrylate. Examples of norbornyl (meth) acrylate may include 3-methyl-norbornylmethyl (meth) acrylate, norbornylmethyl (meth) acrylate, norbornyl (meth) acrylate, 1,3,3-trimethyl-norbornyl (meth) acrylate, myrtanylmethyl (meth) acrylate, isopinocampheyl (meth) acrylate, 2-{[5-(1',1',1'-trifluoro-2'-trifluoromethyl-2'-hydroxy)propyl]norbornyl}(meth) acrylate. Examples of adamantyl (meth) acrylate include 2-methyl-2-adamantyl (meth) acrylate, 2-ethyl-2-adamantyl (meth) acrylate, 3-hydroxy-1-adamantyl (meth) acrylate, 1-adamantyl-α-trifluoromethyl (meth) acrylate.

As the high-softening-point monomer (a2), an SiO-containing monomer (a4) may be used in place of or in addition to the hydrocarbon-based (meth) acrylate in the above. The SiO-containing monomer may be a compound having a siloxane bond(s) and at least one (e.g. one or two) carbon-carbon double bond(s). The SiO-containing monomer is preferably silicone (meth) acrylate or alkoxysilane group-containing (meth) acrylate.

Silicone (meth) acrylate is dimethyl polysiloxane having a molecular weight of 1,000 to 10,000 and being modified with a (meth) acryloyl group(s) at its one or both terminals, and can be exemplified by the following formulae (1) to (3).

Formulae (1) to (3):

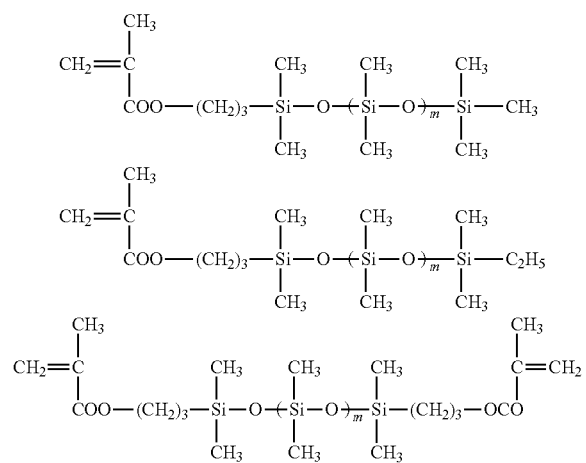

Preferred and commercially available ones as the SiO-containing monomer include the following:

For the SiO-containing monomer, silicone (meth) acrylate includes: SILAPLANE FM-0611, SILAPLANE FM-0621, SILAPLANE FM-0625; bi-terminal type (meth) acrylic SILAPLANEs such as SILAPLANE FM-7711, SILAPLANE FM-7721 and SILAPLANE FM-7725 etc.; SILAPLANE FM-0411, SILAPLANE FM-0421, SILAPLANE FM-0428, SILAPLANE FM-DA11, SILAPLANE FM-DA21, SILAPLANE DA25; mono-terminal type (meth) acrylic SILAPLANEs such as SILAPLANE FM-0711, SILAPLANE FM-0721, SILAPLANE FM-0725, SILAPLANE TM-0701 and SILAPLANE TM-0701T etc. (produced by JCN Co., Ltd.). Polyfunctional acrylate includes A-9300, A-9300-1CL, A-GLY-9E, A-GLY-20E, A-TMM-3, A-TMM-3L, A-TMM-3LM-N, A-TMPT, A-TMMT and so on, and polyfunctional methacrylate includes TMPT and so on (produced by Shin-Nakamura Chemical Co., Ltd.).

For the SiO-containing monomer, alkoxysilane group-containing (meth) acrylate includes exemplarily: 3-(meth) acryloyloxypropyl trichlorosilane, 3-(meth) acryloyloxypropyl trimethoxysilane, 3-(meth) acryloyloxypropyl triethoxysilane, 3-(meth) acryloyloxypropyl triisopropoxysilane, (also referred to as (triisopropoxysilyl) propyl methacrylate (abbreviation: TISMA) and (triisopropoxysilyl) propyl acrylate), 3-(meth) acryloxyisobutyl trichlorosilane, 3-(meth) acryloxyisobutyl triethoxysilane, 3-(meth) acryloxyisobutyl triisopropoxysilane, 3-(meth) acryloxyisobutyl trimethoxysilane and the like.

A glass transition point and a melting point mean the extrapolated glass transition end temperature ($T_{eg}$) and the melting peak temperature ($T_{pm}$), respectively, which are defined in the "Testing Methods for Transition Temperatures of Plastics" of JIS K7121-1987. In a case where the high-softening-point monomer (a2) exhibiting a melting point or glass transition point at least 50° C., preferably at least 100° C. in the state of homopolymer is used for the repeating units of fluoropolymer (A), this brings about an effect of excellent dimensional stability when the substrate is subjected to heat treatment, and also an effect of improved liquid repellency of the fluoromonomer (A).

In addition to the two kinds of monomers in the fluoropolymer (A), the epoxy group-containing monomer (a3-1) which may further be copolymerized as the third monomer includes glycidyl (meth) acrylate, 3,4-epoxybutyl (meth) acrylate, 3,4-epoxycyclohexylmethyl (meth) acrylate and so on. Preferable is glycidyl (meth) acrylate.

As the hydroxyl group-containing monomer (a3-2), there are monohydroxy mono (meth) acrylate, monohydroxy oligo (meth) acrylate, oligo hydroxy oligo (meth) acrylate. From the viewpoint of reactivity, monohydroxy alkyl mono (meth) acrylate is preferred. Monohydroxy alkyl mono (meth) acrylate includes, for example, 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate and so on. In particular, hydroxyethyl (meth) acrylate is preferred.

When the epoxy group-containing monomer (a3-1) is copolymerized, additionally the epoxy group may be reacted with an unsaturated organic acid. An example of the unsaturated organic acid is a monomer having at least one carbon-carbon double bond and at least one acid group [e.g., a carboxyl group (COOH group)], and is copolymerized to produce the fluoropolymer (A) having an acid value of 40 to 200 mgKOH/g. The acid value is defined in JIS 0070. 2.1, and means a number in mg of potassium hydroxide required to neutralize free fatty acids, resin acids, etc. that are contained in 1 g of the sample. Particularly preferred examples of the unsaturated organic acid may be unsaturated carboxylic acids, for example, a free unsaturated carboxylic acid and an unsaturated carboxylic acid anhydride. Examples of the unsaturated organic acid may be (meth) acrylic acid, vinyl acetate, crotonic acid, itaconic acid, itaconic anhydride, maleic acid, maleic anhydride, fumaric acid, phthalic anhydride, tetrahydrophthalic anhydride and cinnamic acid.

When the unsaturated organic acid is reacted, a part of epoxy groups may be left. As described in JP 2001-253928 A, after an unsaturated organic acid such as acrylic acid is reacted with epoxy groups in the polymer, furthermore a hydroxyl group generated thereby may further be reacted with an acid anhydride such as tetrahydrosuccinic anhydride.

When the hydroxyl group-containing monomer (a3-2) is copolymerized, additionally the hydroxyl group may be reacted with an isocyanate group-containing unsaturated compound. The isocyanate group-containing unsaturated compound is preferably an isocyanate group-containing (meth) acrylate. When the isocyanate group-containing unsaturated compound is reacted, a part of hydroxyl groups may be left.

For the fluoropolymer (A), the SiO-containing monomer (a4) may be used. The SiO-containing monomer (a4) may be a compound having a siloxane bond(s) and at least one (e.g. one or two) carbon-carbon double bond(s). The SiO-containing monomer (a4) is preferably silicone (meth) acrylate or alkoxysilane group-containing (meth) acrylate.

Silicone (meth) acrylate is dimethyl polysiloxane having a molecular weight of 1,000 to 10,000 and being modified with a (meth) acryloyl group(s) at its one or both terminals, and can be exemplified by the following formulae (1) to (3).

Formulae (1) to (3):

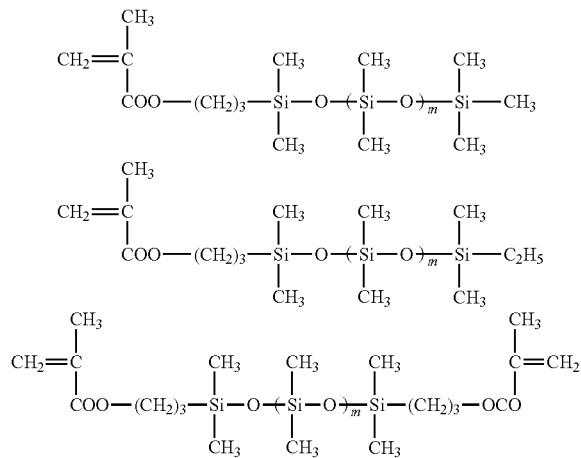

Preferred alkoxysilane group-containing (meth) acrylate is, for example, 3-(meth) acryloyloxypropyl trimethoxysilane, (also referred to as (triisopropoxysilyl) propyl methacrylate (abbreviation: TISMA) and (triisopropoxysilyl) propyl acrylate).

The SiO-containing monomer (a4) is preferably in a range from 2 to 20 parts by weight with respect to 100 parts by weight of the α-position substituted acrylate (a1), and preferably used together with at least one of the crosslinking group-containing monomer containing an epoxy group (a3-1) and/or a hydroxyl group (a3-2) (the epoxy group-containing monomer (a3-1) or the hydroxyl group-containing monomer (a3-2)) (preferable amount thereof is 5 to 30 parts by weight).

For the fluoropolymer (A), the alkyleneoxy group-containing monomer (a5) may be used. An example of the alkyleneoxy group is:

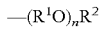

wherein $R^1$ is —$(CH_2)_2$— or —$(CH_2)_3$—, $R^2$ is hydrogen or a methyl group, and n is 1 to 10. As the alkyleneoxy group-containing monomer (a5), the following may be used:

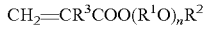

wherein $R^1$ is —$(CH_2)_2$— or —$(CH_2)_3$—, $R^2$ and $R^3$ are hydrogen or a methyl group, and n is 1 to 10.

The monomer (a5) is, specifically, hydroxyethyl (meth) acrylate, polyethylene glycol (meth) acrylate, methyl polyethylene glycol (meth) acrylate, polypropylene glycol (meth) acrylate, methyl polypropylene glycol (meth) acrylate, polyethylene glycol-polypropylene glycol block copolymer (meth) acrylate, methyl-polyethylene glycol-polypropylene glycol block copolymer (meth) acrylate, or the like. For example, BLEMMER AP series (polypropylene glycol monoacrylate), produced by NOF Corporation, such as AP-400 (n≈6), AP-550 (n≈9), AP-800 (n≈13); BLEMMER PE series (polyethylene glycol monomethacrylate) such as PE-90 (n≈2), PE-200 (n≈4.5), PE-350 (n≈8); BLEMMER PP series (polypropylene glycol monomethacrylate) such as PP-1000 (n≈4 to 6), PP-500 (n≈9), PP-800 (n≈13); BLEMMER PME series (methoxy polyethylene glycol monomethacrylate) such as PME-100 (n≈2), PME-200 (n≈4), PME-400 (n≈9), PME-1000 (n≈23), PME-4000 (n≈90); and the like are mentioned as examples.

In a case of using the alkyleneoxy group-containing monomer (a5), the high-softening-point monomer (a2) may or may not be used, but it is preferable not to use the high-softening-point monomer (a2). The amount of the alkyleneoxy group-containing monomer (a5) is preferably 50 parts by weight or less, for example, 1 to 45 parts by weight, specifically 10 to 40 parts by weight with respect to 100 parts by weight of the α-position substituted acrylate. Further, from the viewpoint of solubility, the amount of the alkyleneoxy group-containing monomer (a5) is preferably more than 50 parts by weight, for example, 55 to 300 parts by weight, specifically 70 to 250 parts by weight, and more specifically 100 to 200 parts by weight with respect to 100 parts by weight of the α-position substituted acrylate.

In a case of using the alkyleneoxy group-containing monomer (a5), a part of the terminal groups of (a5) may be reacted with an unsaturated group-containing compound to introduce the unsaturated group into the fluoropolymer (A2) or (A2)'. For example, a hydroxyl group at the terminal may be reacted with an isocyanate group-containing (meth) acrylate.

For the fluoropolymer (A2) of the present invention, it is particularly preferable to use glycidyl (meth) acrylate as the crosslinking group-containing monomer containing an epoxy group (a3-1) and hydroxyethyl (meth) acrylate as the alkyleneoxy group-containing monomer (a5) together. In this case, a part of hydroxyl group of hydroxyethyl (meth) acrylate may be reacted with an unsaturated group-containing compound to introduce the unsaturated group into the fluoropolymer (A2). For example, a hydroxyl group at the terminal may be reacted with an isocyanate group-containing (meth) acrylate. Glycidyl (meth) acrylate has effects of improving a compatibility in the resin mold and resin replica mold material composition, a crosslinking property with other raw material, and alkali solubility.

In conventional polymers, there has been a problem that its preservation stability is very poor because the self-crosslinking is quite strong when a carboxyl group, an epoxy group and a hydroxyl group coexist in the same molecule. In the present invention, such a problem of the stability is avoided since these three kinds of crosslinkable functional groups coexist in the fluoropolymer comprising at least 40% by weight of the α-position substituted acrylate (a1).

Next, a method of manufacturing the fluoropolymer will be described.

The fluoropolymer can be prepared in the following manner. Applicable method is dissolving the monomers and necessary components in a solvent, purging with nitrogen, and then adding a polymerization catalyst thereto and stirring it in the range of 20 to 120° C. for 1 to 20 hours.

As the solvent, an organic solvent, a water-soluble organic solvent, water or the like can be used. The solvent is used in the range of 50 to 90% by weight in the polymer composition.

In order to control the molecular weight of the fluoropolymer, it is also possible to add a chain transfer agent such as mercaptans, alkyl halides or the like. As the mercaptans, n-butyl mercaptan, n-dodecyl mercaptan, t-butyl mercaptan, thioglycolic acid ethyl ester, thioglycolic acid 2-ethylhexyl ester, 2-mercaptoethanol, mercapto acid isooctyl ester, thioglycolate, 3-mercaptopropionic acid, thioglycolic acid methoxy butyl ester, silicone mercaptan (KF-2001 produced by Shin-Etsu Chemical Co., Ltd.) and the like are mentioned as examples. As the alkyl halides, chloroform, carbon tetrachloride, carbon tetrabromide and the like are mentioned as examples. These may be used singly, or may be used in combination of two or more. If the hydroxyl-containing monomer (a3-2) alone and mercaptan alone contact directly with each other, insoluble substance in the solvent may be generated in some cases. Thus, in a case of using them together for polymerization, it is preferable to dilute either of them with the solvent in advance.

A weight-average molecular weight of the fluoropolymer (A) may be 3,000 to 20,000, and preferably 5,000 to 15,000. The weight-average molecular weight of the fluoropolymer is obtained by GPC (gel permeation chromatography) (standard polystyrene equivalent).

<Resin Mold and Resin Replica Mold Material Composition>

Next, a resin mold and resin replica mold material composition of the present invention will be described.

A resin mold and resin replica mold material composition may be a combination of the following components:

the fluoropolymer (A), specifically (A1), (A2) or (A2)', a curable resin or monomer (B), and a crosslinking catalyst (C);

the fluoropolymer (A), specifically (A1), (A2) or (A2)', a curable resin or monomer (B), a crosslinking catalyst (C), and optionally a solvent (D);

the fluoropolymer (A), specifically (A1), (A2) or (A2)', a curable resin or monomer (B), a crosslinking catalyst (C), optionally a solvent (D), and optionally a crosslinking agent (E).

More preferably, a combination may be the following:

the fluoropolymer (A), specifically (A1), (A2) or (A2)', an ultraviolet curable resin or monomer (B), and a photo-crosslinking catalyst (C);

the fluoropolymer (A), specifically (A1), (A2) or (A2)', an ultraviolet curable resin or monomer (B), and a photo-crosslinking catalyst (C), and optionally a solvent (D);

the fluoropolymer (A), specifically (A1), (A2) or (A2)', an ultraviolet curable resin or monomer (B), and a photo-crosslinking catalyst (C), optionally a solvent (D), and optionally a crosslinking agent (E).

It should be noted that a curable resin (or polymer) or monomer (B) corresponds to a curable resin or curable monomer which is able to form a mold resin or a replica mold resin for imprinting.

In order to prepare a resin mold and resin replica mold material, the fluoropolymer (A), specifically (A1), (A2) or (A2)' (for example, copolymer of tertiary, quaternary, quinary or senary blend system) is preferably in a range from 0.1 to 10 parts by weight, and preferably in a range from 1 to 5 parts by weight with respect to 100 parts by weight of the curable resin or monomer (B). Further, it is preferable to prepare the composition which consists of the crosslinking catalyst (C), optionally the solvent (D), and optionally the crosslinking agent (E) in addition to them. The curable resin or monomer (B) may be photo-curable or thermal-curable (or thermosetting), and depending on it the crosslinking catalyst (C) may be a photo-crosslinking catalyst or a thermal-crosslinking catalyst. Among them, a photo-curable resin or monomer (B) is preferable, and accordingly a photo-crosslinking catalyst (C) is preferable. Further, the photo-crosslinking catalyst (C) is especially preferably a photo-radical polymerization initiator.

A material for forming a mold resin or a material forming a replica mold resin for imprinting, which is to be mixed with the fluoropolymer in the present invention, will be described. These may be any of a curable resin, preferably a photothermal-curable resin, or a curable monomer, preferably a photothermal-curable monomer. The curable resin or the curable monomer is preferably an ultraviolet curable resin or an ultraviolet curable monomer. The curable resin is not particularly limited as long as the resin having heat resistance and strength. Examples thereof include acrylic polymers, polycarbonate polymers, polyester polymers, polyamide polymers, polyimide polymers, polyethersulfone polymers, cyclic polyolefin polymers, fluorine-containing polyolefin polymers (PTFE, etc.), fluorine-containing cyclic non-crystalline polymers (CYTOP (registered trademark), Teflon (registered trademark) AF, etc.), and so on. When an operation such as UV curing is required after imprinting, the resin having transparency is preferable.

Specifically, examples include alkyl vinyl ethers such as cyclohexylmethyl vinyl ether, isobutyl vinyl ether, cyclohexyl vinyl ether, ethyl vinyl ether and the like, glycidyl vinyl ether, vinyl acetate, vinyl pivalate, various (meth) acrylates such as phenoxyethyl acrylate, benzyl acrylate, stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, ethoxyethyl acrylate, methoxyethyl acrylate, glycidyl acrylate, tetrahydrofurfuryl acrylate, diethylene glycol diacrylate, neopentyl glycol diacrylate, polyoxyethylene glycol diacrylate, tripropylene glycol diacrylate, 2-hydroxyethyl acrylate, 2-hydroxypropyl acrylate, 4-hydroxybutyl vinyl ether, N,N-diethylaminoethyl acrylate, N,N-dimethylaminoethyl acrylate, N-vinylpyrrolidone, dimethylaminoethyl methacrylate, silicone-based acrylate and the like, maleic acid, vinylene carbonate, polyacrylates having linear side chain, polyacrylates having cyclic side chain, polynorbornene, polynorbornadiene, polycarbonate, polysulfone amide, fluorine-containing cyclic non-crystalline polymers (CYTOP (registered trademark), Teflon (registered trademark) AF, etc.), and so on.

The curable monomer is exemplified by the following:
(a) urethane (meth) acrylate,
(b) epoxy (meth) acrylate,
(c) polyester (meth) acrylate,
(d) polyether (meth) acrylate,
(e) silicone (meth) acrylate,
(f) (meth) acrylate monomer.

Specifically, examples include the following:
(a) Urethane (meth) acrylate is exemplified by poly [(meth) acryloyloxyalkyl] isocyanurate represented by tris (2-hydroxyethyl) isocyanurate diacrylate, tris (2-hydroxyethyl) isocyanurate triacrylate and the like can be mentioned as examples.

(b) Epoxy (meth) acrylate is one obtained by adding a (meth) acryloyl group(s) to an epoxy group(s), and common ones are those obtained by using bisphenol A, bisphenol F, phenol novolac, an alicyclic compound as a starting material.

(c) Polyhydric alcohol constituting a polyester unit of polyester (meth) acrylate is exemplified by ethylene glycol, 1,4-butanediol, 1,6-hexanediol, diethylene glycol, trimethylolpropane, dipropylene glycol, polyethylene glycol, polypropylene glycol, pentaerythritol, dipentaerythritol and the like; and polybasic acid thereof is exemplified by phthalic acid, adipic acid, maleic acid, trimellitic acid, itaconic acid, succinic acid, terephthalic acid, alkenyl succinic acid and the like.

(d) Polyether (meth) acrylate is exemplified by polyethylene glycol di (meth) acrylate, polypropylene glycol di (meth) acrylate, polyethylene glycol-polypropylene glycol di (meth) acrylate, and the like.

(e) Silicone (meth) acrylate is dimethyl polysiloxane having a molecular weight of 1,000 to 10,000 and being modified with a (meth) acryloyl group(s) at its one or both terminals, and can be exemplified by the following formulae (1) to (3).

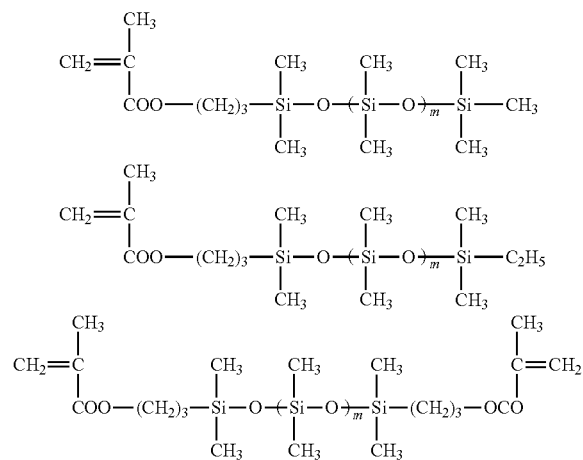

(f) (Meth) acrylate monomer is exemplified by methyl (meth) acrylate, ethyl (meth) acrylate, n-propyl (meth) acrylate, isopropyl (meth) acrylate, n-butyl (meth) acrylate, isobutyl (meth) acrylate, sec-butyl (meth) acrylate, t-butyl (meth) acrylate, n-pentyl (meth) acrylate, 3-methylbutyl (meth) acrylate, n-hexyl (meth) acrylate, 2-ethyl-n-hexyl (meth) acrylate, n-octyl (meth) acrylate, cyclohexyl (meth) acrylate, isobornyl (meth) acrylate, benzyl (meth) acrylate, 2-hydroxyethyl (meth) acrylate, 2-hydroxypropyl (meth) acrylate, 3-hydroxy propyl (meth) acrylate, 4-hydroxybutyl (meth) acrylate, 5-hydroxypentyl (meth) acrylate, 6-hydroxyhexyl (meth) acrylate, 4-hydroxycyclohexyl (meth) acrylate, neopentyl glycol mono (meth) acrylate, 3-chloro-2-hydroxypropyl (meth) acrylate, (1,1-dimethyl-3-oxobutyl) (meth) acrylic rate, 2-acetoacetoxyethyl (meth) acrylate, 2-methoxyethyl (meth) acrylate, 2-ethoxyethyl (meth) acrylate, neopentyl glycol mono (meth) acrylate, 3-chloro-2-hydroxypropyl (meth) acrylate, glycerol mono (meth) acrylate, ethylene glycol diacrylate, propylene glycol diacrylate, 1,6-hexanediol diacrylate, 1,9-nonanediol diacrylate, 1,10-decanediol diacrylate, trimethylol propane triacrylate, pentaerythritol tetraacrylate and the like.

Among the curable resin and curable monomer used in the resin mold and resin replica mold material composition of the present invention, preferred and commercially available ones include the following:

For the curable monomer, silicone acrylate-based resin includes: SILAPLANE FM-0611, SILAPLANE FM-0621, SILAPLANE FM-0625; bi-terminal type (meth) acrylic SILAPLANEs such as SILAPLANE FM-7711, SILAPLANE FM-7721 and SILAPLANE FM-7725 etc.; SILAPLANE FM-0411, SILAPLANE FM-0421, SILAPLANE FM-0428, SILAPLANE FM-DA11, SILAPLANE FM-DA21, SILAPLANE DA25; mono-terminal type (meth) acrylic SILAPLANEs such as SILAPLANE FM-0711, SILAPLANE FM-0721, SILAPLANE FM-0725, SILAPLANE TM-0701 and SILAPLANE TM-0701T etc. (produced by JCN Co., Ltd.). Polyfunctional acrylate includes A-9300, A-9300-1CL, A-GLY-9E, A-GLY-20E, A-TMM-3, A-TMM-3L, A-TMM-3LM-N, A-TMPT, A-TMMT and so on, and polyfunctional methacrylate includes TMPT and so on (produced by Shin-Nakamura Chemical Co., Ltd.).

For the curable monomer, alkoxysilane group-containing (meth) acrylate includes exemplarily: 3-(meth) acryloyloxypropyl trichlorosilane, 3-(meth) acryloyloxypropyl trimethoxysilane, 3-(meth) acryloyloxypropyl triethoxysilane, 3-(meth) acryloyloxypropyl triisopropoxysilane, (also referred to as (triisopropoxysilyl) propyl methacrylate (abbreviation: TISMA) and (triisopropoxysilyl) propyl acrylate), 3-(meth) acryloxyisobutyl trichlorosilane, 3-(meth) acryloxyisobutyl triethoxysilane, 3-(meth) acryloxyisobutyl triisopropoxysilane, 3-(meth) acryloxyisobutyl trimethoxysilane and the like.

For the curable resin, silicone resins PAK-01, PAK-02 (produced by Toyo Gosei Co., Ltd.), nanoimprint resin NIF series (produced by Asahi Glass Co., Ltd.), nanoimprint resin OCNL series (produced by Tokyo Ohka Kogyo Co., Ltd.), NIAC2310 (produced by Daicel Chemical Industries, Co., Ltd.), epoxy acrylate resins EH-1001, ES-4004, EX-C101, EX-C106, EX-C300, EX-0501, EX-0202, EX-0205, EX-5000, etc. (produced by Kyoeisha Chemical Co., Ltd.), hexamethylene diisocyanate-based polyisocyanates SUMIDUR N-75, SUMIDUR N3200, SUMIDUR HT, SUMIDUR N3300, SUMIDUR N3500 (produced by Sumitomo Bayer Urethane Co., Ltd.), and the like can be mentioned.

Next, the crosslinking catalyst (C) used in the curing step will be described.

The crosslinking catalyst (C) is exemplified by a radical polymerization initiator (C1) and an acid generator (C2). The radical polymerization initiator (C1) is a compound that generates a radical(s) by heat or light, and exemplified by a radical thermal polymerization initiator and a radical photopolymerization initiator. In the present invention, a radical photopolymerization initiator is preferred.

Examples of the radical thermal polymerization initiator include: diacyl peroxides such as benzoyl peroxide, lauroyl peroxide; dialkyl peroxides such as dicumyl peroxide and di-t-butyl peroxide; peroxy carbonates such as diisopropyl peroxy dicarbonate, bis(4-t-butyl cyclohexyl) peroxy dicarbonate; peroxide compounds of alkyl peresters such as t-butylperoxy octoate and t-butylperoxy benzoate; and radical-generating azo compounds such as azobisisobutyronitrile.

As the radical photopolymerization initiator, photopolymerization initiators exemplified below is preferably used in the present invention. For example, α-diketones such as benzyl, diacetyl; acyloins such as benzoin; acyloin ethers such as benzoin methyl ether, benzoin ethyl ether, benzoin isopropyl ether; thioxanthones such as thioxanthone, 2,4-diethyl thioxanthone, thioxanthone-4-sulfonic acid; benzophenones such as benzophenone, 4,4'-bis(dimethylamino) benzophenone, 4,4'-bis(diethylamino) benzophenone; acetophenones such as acetophenone, p-dimethylamino acetophenone, 2,2'-dimethoxy-2-phenyl acetophenone, p-methoxyacetophenone, 2-methyl[4-(methylthio)phenyl]-2-morpholino-1-propanone, 2-benzyl-2-dimethylamino-1-(4-morpholinophenyl)-butane-1-one; quinones such as anthraquinone, 1,4-naphthoquinone; amino benzoic acids such as 2-dimethyl amino benzoic acid ethyl ester, 4-dimethylamino benzoic acid ethyl ester, 4-dimethyl amino benzoic acid (n-butoxy) ethyl ester, 4-dimethyl amino benzoic acid isoamyl ester, 4-dimethyl amino benzoic acid 2-ethylhexyl ester; halogen compounds such as phenacyl chloride, trihalomethyl phenyl sulfone; acyl phosphine oxides; peroxides such as di-t-butyl peroxide; and the like can be mentioned. If the epoxy group-containing monomer (a3-1) is contained in the fluoropolymer, it is possible to use quinone diazide group-containing compounds described in JP 2003-76012 A as the radical polymerization initiator (C1).

The acid generator (AG) (C2) is a material being capable of reacting by the addition of heat or light to generate an acid. A thermal acid generator, for example, is exemplified by benzoin tosylate, nitrobenzyl tosylate (especially, 4-nitrobenzyl tosylate), alkyl esters of other organic sulfonic acid, and the like. However, a photochemical acid generator (PAG) (C2') described below is preferably used in the present invention. The photochemical acid generator is composed of a chromophore for absorbing a light and an acid precursor giving an acid after decomposition, and the irradiation to the PAG having such structure with a light of a specific wavelength excites the PAG to generate an acid from the acid precursor part.

Commercially available products of the radical photopolymerization initiator (C1) include:

IRGACURE 651: 2,2-dimethoxy-1,2-diphenyl ethane-1-one,

IRGACURE 184: 1-hydroxy-cyclohexyl-phenyl-ketone,

IRGACURE 2959: 1-[4-(2-hydroxyethoxy)-phenyl]-2-hydroxy-2-methyl-1-propane-1-one, IRGACURE 127: 2-hydroxy-1-{4-[4-(2-hydroxy-2-methyl-propionyl)-benzyl]-phenyl}-2-methyl-propane-1-one, IRGACURE 907: 2-methyl-1-(4-methylthiophenyl)-2-morpholinopropane-1-one, IRGACURE 369: 2-benzyl-2-dimethylamino-1-(4-morpholinophenyl)-butanone-1, IRGACURE 379: 2-(dimethylamino)-2-[(4-methylphenyl)methyl]-1-[4-(4-morpholinyl)phenyl]-1-butanone, IRGACURE 819: bis(2,4,6-trimethylbenzoyl)-phenylphosphine oxide, IRGACURE 784: bis(η5-2,4-cyclopentadiene-1-yl)-bis (2,6-difluoro-3-(1H-pyrrole-1-yl)-phenyl) titanium, IRGACURE OXE 01: 1,2-octanedione, 1-[4-(phenylthio)-, 2-(O-benzoyloxime)], IRGACURE OXE 02: ethanone, 1-[9-ethyl-6-(2-methylbenzoyl)-9H-carbazole-3-yl]-, 1-(0-acetyloxime),

IRGACURE 261, IRGACURE 369, IRGACURE 500,

DAROCUR 1173: 2-hydroxy-2-methyl-1-phenyl-propane-1-one,

DAROCUR TPO: 2,4,6-trimethylbenzoyl-diphenyl-phosphine oxide,

DAROCUR 1116, DAROCUR 2959, DAROCUR 1664, DAROCUR 4043,

IRGACURE 754: Mixture of oxy-phenyl acetic acid, 2-[2-oxo-phenylacetoxyethoxy]ethyl ester and oxy-phenyl acetic acid, 2-(2-hydroxyethoxy) ethyl ester, IRGACURE 500: Mixture of IRGACURE 184: benzophenone=1:1, IRGACURE 1300: Mixture of IRGACURE 369: IRGACURE 651=3:7, IRGACURE 1800: Mixture of CGI403: IRGACURE 184=1:3, IRGACURE 1870: Mixture of CGI403: IRGACURE 184=7:3, DAROCUR 4265: Mixture of DAROCUR TPO: DAROCUR 1173=1:1. IRGACUREs are produced by Ciba Specialty Chemicals Inc., and DAROCURs are produced by Merck Japan.

Further, a sensitizer such as diethylthioxanthone and isopropylthioxanthone, and a polymerization accelerator such as DAROCUR EDB (ethyl-4-dimethylaminobenzoate) and DAROCUR EHA (2-ethylhexyl-4-dimethylaminobenzoate) may be used additionally.

The photochemical acid generator (PAG) (C2') is a material being capable of reacting by the irradiation with light to generate an acid. The PAG is composed of a chromophore for absorbing a light and an acid precursor giving an acid after decomposition, and the irradiation to the PAG having such structure with a light of a specific wavelength excites the PAG to generate an acid from the acid precursor part. For example, the PAG is exemplified by salts such as diazonium salts, phosphonium salts, sulfonium salts, iodonium salts, $CF_3SO_3$, p-$CH_3PhSO_3$, p-$NO_2PhSO_3$ (wherein Ph means a phenyl group) and so on, and organic halogen compounds, orthoquinone-diazide sulfonyl chloride, esters of sulfonic acids or the like.

The organic halogen compound is a compound being capable of forming a hydrohalic acid (e.g., hydrogen chloride).

Other compounds being capable of generating an acid by the irradiation with light than those described in the above may be, for example, 2-halomethyl-5-vinyl-1,3,4-oxadiazole compound, 2-trihalomethyl-5-aryl-1,3,4-oxadiazole compound, 2-trihalomethyl-5-hydroxyphenyl-1,3,4-oxadiazole compound.

Commercially available products of PAG (C2) are exemplified by the following.

WPAG-145 [bis(cyclohexyl sulfonyl) diazomethane], WPAG-170 [bis(t-butyl sulfonyl) diazomethane], WPAG-199 [bis(p-toluene sulfonyl) diazomethane], WPAG-281 [triphenylsulfonium trifluoromethanesulfonate], WPAG-336 [diphenyl-4-methylphenylsulfonium trifluoromethanesulfonate], WPAG-367 [diphenyl-2,4,6-trimethylphenylsulfonium p-toluenesulfonate] produced by Wako Pure Chemical Industries, Ltd.; IRGACURE PAG103 [(5-propylsulfonyloxyimino-5H-thiophen-2-ylidene)-(2-methylphenyl)acetonitrile], IRGACURE PAG108 [ (5-octylsulfonyloxyimino-5H-thiophen-2-ylidene)-(2-methylphenyl) acetonitrile)], IRGACURE PAG121 [(5-p-toluenesulfonyloxyimino-5H-thiophen-2-ylidene)-(2-methylphenyl)acetonitrile], IRGACURE PAG203, CGI725 produced by Ciba Specialty Chemicals Inc.; TFE-triazine[2-[2-(furan-2-yl) ethenyl]-4,6-bis(trichloromethyl)-s-triazine], TME-triazine [2-[2-(5-methyl-furan-2-yl)ethenyl]-4,6-bis(trichloromethyl)-s-triazine], MP-triazine[2-(methoxyphenyl)-4,6-bis (trichloromethyl)-s-triazine], dimethoxy[2-[2-(3,4-dimethoxyphenyflethenyl]-4,6-bis(trichloromethyl)-s-triazine] produced by Sanwa Chemical Co.; and so on can be used.

The amount of the crosslinking catalyst (C) is preferably 0.1 to 20 parts by weight, specifically 1 to 10 parts by weight with respect to 100 parts by weight of the fluoropolymer or the total of the fluoropolymer and the crosslinking agent.

Next, the solvent (D) will be described.

A solvent (specifically, water-soluble organic solvent, an organic solvent (specifically oil-soluble organic solvent), and water) may be added to the resin mold and resin replica mold material composition of the present invention as necessary. A solvent of the same type is also used for producing the fluoropolymer. The solvent is inactive to the fluoropolymer (A) and is to dissolve therein. Examples of solvents include: as the water-soluble organic solvent, acetone, methyl ethyl ketone (MEK), methyl amyl ketone, ethyl acetate, propylene glycol, propylene glycol monomethyl ether, propylene glycol monomethyl ether acetate (PGMEA), dipropylene glycol, dipropylene glycol monomethyl ether, dipropylene glycol dimethyl ether, dipropylene glycol monomethyl ether acetate, dipropylene glycol diacetate, tripropylene glycol, 3-methoxybutyl acetate (MBA), 1,3-butylene glycol diacetate, cyclohexanol acetate, dimethylformamide, dimethyl sulfoxide, methyl cellosolve, cellosolve acetate, butyl cellosolve, butyl carbitol, carbitol acetate, ethyl lactate, isopropyl alcohol, methanol, ethanol, and so on: and as the organic solvent, chloroform, HFC141b, HCHC225, hydrofluoroether, pentane, hexane, heptane, octane, cyclohexane, benzene, toluene, xylene, petroleum ether, tetrahydrofuran, 1,4-dioxane, methyl isobutyl ketone, butyl acetate, 1,1,2,2-tetrachloroethane, 1,1,1-trichloroethane, trichlorethylene, perchlorethylene, tetrachlorodifluoroethane, trichlorotrifluoroethane and so one. These solvents may be used singly, or may be used in combination of two or more. From the viewpoints of safety and solubility of the fluoropolymer and raw materials constituting a resist, the solvent is preferably MBA and PGMEA in particular.

The solvent is preferably used in a range from 30 to 95% by weight, for example, from 50 to 90% by weight in the resin mold and resin replica mold material composition.

Next, the crosslinking agent component (E) will be described.

The crosslinking agent is a compound being monofunctional or preferably having two or more functional groups. Preferable ones are of a type cured by a radical polymerization reaction, but ones of a type cured by cationic polymerization reaction may be used. The former has a functional group(s) of an unsaturated double bond group such as an acryloyl group and a vinyl group, the latter has a functional group(s) of an epoxy group, a vinyl ether group, or an oxetane group, and these are classified as follows:

(a) urethane (meth) acrylate,
(b) epoxy (meth) acrylate,
(c) polyester (meth) acrylate,
(d) polyether (meth) acrylate,
(e) silicone (meth) acrylate,
(f) (meth) acrylate monomer,
(g) epoxy based monomer,
(h) vinyl ether based monomer,
(i) oxetane based monomer.

In the above, (a) to (f) are of the type cured by radical polymerization reaction, and (g) to (i) are of the type cured by cationic polymerization reaction.

Note that (a) to (e) are those obtained by adding a (meth) acryloyl group(s) to the resin, and often referred to as oligomer, base resin, prepolymer or so.

(a) Urethane (meth) acrylate has a (meth) acryloyl group and a urethane bond in its molecule. Examples are poly [(meth) acryloyloxyalkyl]isocyanurates represented by tris (2-hydroxyethyl) isocyanurate diacrylate, tris-(2-hydroxyethyl) isocyanurate triacrylate and the like. Isocyanurate is a trifunctional isocyanate compound, and one isocyanate thereof may form an urethane bond with a compound having a hydroxyl group and an alkyl group (carbon number of 1 to 20) or a fluoroalkyl group (carbon number of 1 to 6) or a perfluoropolyether group (molecular weight of 1,000 to 50,000) in one molecule.

(b) Epoxy (meth) acrylate is one obtained by adding a (meth) acryloyl group(s) to an epoxy group(s), and common ones are those obtained by using bisphenol A, bisphenol F, phenol novolac, an alicyclic compound as a starting material.

(c) Polyester (meth) acrylate may be one obtained by adding (meth) acrylate to an ester resin composed of polyhydric alcohol and polybasic acid. Polyhydric alcohol may be ethylene glycol, 1,4-butanediol, 1,6-hexanediol, diethylene glycol, trimethylolpropane, dipropylene glycol, polyethylene glycol, polypropylene glycol, pentaerythritol, dipentaerythritol and the like; and polybasic acid may be phthalic acid, adipic acid, maleic acid, trimellitic acid, itaconic acid, succinic acid, terephthalic acid, alkenyl succinic acid and the like.

(d) Polyether (meth) acrylate is one obtained by adding (meth) acrylate to a polyether resin of diol, and exemplified by polyethylene glycol di (meth) acrylate, polypropylene glycol di (meth) acrylate, polyethylene glycol-polypropylene glycol di (meth) acrylate, and the like.

(e) Silicone (meth) acrylate is dimethyl polysiloxane having a molecular weight of 1,000 to 10,000 and being modified with a (meth) acryloyl group(s) at its one or both terminals, and can be exemplified by the above formulae (1) to (3).

(f) (Meth) acrylate monomer may be monofunctional or polyfunctional alkyl (meth) acrylate or polyether (meth) acrylate having a low-viscosity of 500 mPa·s (25° C.) or less, and is exemplified by methyl (meth) acrylate, ethyl (meth) acrylate, n-propyl (meth) acrylate, isopropyl (meth) acrylate, n-butyl (meth) acrylate, isobutyl (meth) acrylate, sec-butyl (meth) acrylate, t-butyl (meth) acrylate, n-pentyl (meth) acrylate, 3-methylbutyl (meth) acrylate, n-hexyl (meth) acrylate, 2-ethyl-n-hexyl (meth) acrylate, n-octyl (meth) acrylate, cyclohexyl (meth) acrylate, isobornyl (meth) acrylate, benzyl (meth) acrylate, 2-hydroxyethyl (meth) acrylate, 2-hydroxypropyl (meth) acrylate, 3-hydroxypropyl (meth) acrylate, 4-hydroxybutyl (meth) acrylate, 5-hydroxypentyl (meth) acrylate, 6-hydroxyhexyl (meth) acrylate, 4-hydroxy-cyclohexyl (meth) acrylate, neopentyl glycol mono (meth) acrylate, 3-chloro-2-hydroxypropyl (meth) acrylate, (1,1-dimethyl-3-oxobutyl) (meth) acrylate, 2-acetoacetoxyethyl (meth) acrylate, 2-methoxyethyl (meth) acrylate, 2-ethoxyethyl (meth) acrylate, neopentyl glycol mono (meth) acrylate, 3-chloro-2-hydroxypropyl (meth) acrylate, glycerol mono (meth) acrylate, ethylene glycol diacrylate, propylene glycol diacrylate, 1,6-hexanediol diacrylate, 1,9-nonanediol diacrylate, 1,10-decanediol diacrylate, trimethylol propane triacrylate, pentaerythritol tetra-acrylate and the like.

(g) Epoxy based monomer is exemplified by epoxy monomers of: glycidyl ethers of phenols such as bisphenol A, bisphenol F, resorcinol, phenol novolac and cresol novolac; glycidyl ethers of alcohols such as butanediol, polyethylene glycol, and polypropylene glycol; glycidyl esters of carboxylic acids such as phthalic acid, isophthalic acid, tetrahydrophthalic acid; and oligomers thereof, and alicyclic epoxides. Among them, bisphenol A glycidyl ether monomer or oligomer is preferably used. Specifically, Epikote 828 (molecular weight of 380), Epikote 834 (molecular weight of 470), Epicoat 1001 (molecular weight of 900), Epikote 1002 (molecular weight of 1,060), Epicoat 1055 (molecular weight of 1,350), and Epikote 1007 (molecular weight of 2,900) produced by Yuka Shell can be mentioned as examples.

(h) Vinyl ether based monomer is exemplified by 2-hydroxyethyl vinyl ether, 4-hydroxybutyl vinyl ether, cyclohexanediol monovinyl ether, cis-1,1,3-trimethyl-5-vinyloxy cyclohexane, trans-1,1,3-trimethyl-5-vinyloxy cyclohexane, 1-isopropyl-4-methyl-2-vinyloxy cyclohexane, 2-vinyloxy-7-oxabicyclo[3.2.1]octane-6-one, 2-methyl-2-vinyloxy adamantane, 2-ethyl-2-vinyloxy adamantane, 1,3-bis(vinyloxy) adamantane, 1-vinyloxy adamantanol, 3-vinyloxy-1-adamantanol, 1,3,5-tris(vinyloxy)adamantane, 3,5-bis (vinyloxy)-1-adamantanol, 5-vinyloxy-1,3-adamantane diol, 1,3,5,7-tetrakis(vinyloxy)adamantane, 3,5,7-tris (vinyloxy)-1-adamantanol, 5,7-bis(vinyloxy)-1,3-adamantane diol, 7-vinyloxy-1,3,5-adamantane triol, 1,3-dimethyl-5-vinyloxy adamantane, 1,3-dimethyl-5,7-bis(vinyloxy)adamantane, 3,5-dimethyl-7-vinyloxy-1-adamantanol, 1-carboxy-3-vinyloxy adamantane, 1-amino-3-vinyloxy adamantane, 1-nitro-3-vinyloxy adamantane, 1-sulfo-3-vinyloxy adamantane, 1-t-butyloxycarbonyl-3-vinyloxy adamantane, 4-oxo-1-vinyloxy adamantane, 1-vinyloxy-3-(1-methyl-1-vinyloxyethyl)adamantane, 1-(vinyloxymethyl) adamantane, 1-(1-methyl-1-vinyloxyethyl)adamantane, 1-(1-ethyl-1-vinyloxyethyl)adamantane, 1,3-bis(1-methyl-1-vinyloxyethyl)adamantane, 1-(1-(norbornan-2-yl)-1-vinyloxyethyl)adamantane, 2,5-bis(vinyloxy)norbornane, 2,3-bis(vinyloxy)norbornane, 5-methoxycarbonyl-2-vinyloxy norbornane, 2-(1-(norbornane-2-yl)-1-vinyloxyethyl)norbornane, 2-(vinyloxymethyl)norbornane, 2-(1-methyl-1-vinyloxyethyl)norbornane, 2-(1-methyl-1-vinyloxypentyl) norbornane, 3-hydroxy-4-vinyloxytetracyclo[4.4.0.1$^{2,5}$.1$^{7,10}$]dodecane, 3,4-bis(vinyloxy)tetracyclo[4.4.0.1$^{2,5}$.1$^{7,10}$]dodecane, 3-hydroxy-8-vinyloxytetracyclo[4.4.0.1$^{2,5}$.1$^{7,10}$]dodecane, 3,8-bis(vinyloxy)tetracyclo[4.4.0.1$^{2,5}$.1$^{7,10}$]dodecane, 3-methoxycarbonyl-8-vinyloxytetracyclo[4.4.0.1$^{2,5}$.1$^{7,10}$]dodecane, 3-methoxycarbonyl-9-vinyloxytetracyclo[4.4.0.1$^{2,5}$.1$^{7,10}$]dodecane, 3-(vinyloxymethyl)tetracyclo[4.4.0.1$^{2,5}$.1$^{7,10}$]dodecane, 3-hydroxymethyl-8-vinyloxytetracyclo[4.4.0.1$^{2,5}$.1$^{7,10}$]dodecane, 3-hydroxy-9-vinyloxytetracyclo[4.4.0.1$^{2,5}$.1$^{7,10}$]dodecane, 8-hydroxy-3-(vinyloxymethyl)tetracyclo[4.4.0.1$^{2,5}$.1$^{7,10}$]dodecane, 9-hydroxy-3-(vinyloxymethyl)tetracyclo[4.4.0.1$^{2,5}$.1$^{7,10}$]dodecane, 8-vinyloxy-4-oxatricyclo[5.2.1.0$^{2,6}$]decane-3,5-dione, 4-vinyloxy-11-oxapentacyclo[6.5.1.1$^{3,6}$.0$^{2,7}$.0$^{9,13}$]pentadecane-10,12-dione, α-vinyloxy-γ,γ-dimethyl-γ-butyrolactone, α,γ,γ-trimethyl-α-vinyloxy-γ-butyrolactone, γ,γ-dimethyl-β-methoxycarbonyl-α-vinyloxy-γ-butyrolactone, 8-vinyloxy-4-oxatricyclo[5.2.1.0$^{2,6}$]decan-3-one, 9-vinyloxy-4-oxatricyclo[5.2.1.0$^{2,6}$]decan-3-one, 8,9-bis(vinyloxy)-4-oxatricyclo[5.2.1.0$^{2,6}$]decan-3-one, 4-vinyloxy-2,7-dioxabicyclo[3.3.0]octane-3,6-dione, 5-vinyloxy-3-oxatricyclo[4.2.1.0$^{4,8}$]nonane-2-one, 5-methyl-5-vinyloxy-3-oxatricyclo[4.2.1.0$^{4,8}$]nonane-2-one, 9-methyl-5-vinyloxy-3-oxatricyclo[4.2.1.0$^{4,8}$]nonane-2-one, 6-vinyloxy-3-oxatricyclo[4.3.1.1$^{4,8}$]undecane-2-one, 6,8-bis(vinyloxy)-3-oxatricyclo[4.3.1.1$^{4,8}$]undecane-2-one, 6-hydroxy-8-vinyloxy-3-oxatricyclo[4.3.1.1$^{4,8}$]undecane-2-one, 8-hydroxy-6-vinyloxy-3-oxatricyclo[4.3.1.1$^{4,8}$]undecane-2-one, and isopropenyl ethers corresponding to these, and the like.

(i) Oxetane based monomer is exemplified by 1,4-bis{[(3-ethyl-3-oxetanyl)methoxy]ethyl}benzene (ARON OXETANE OXT-121 produced by Toagosei Co., Ltd.), 3-ethyl-3-hydroxymethyloxetane (ARON OXETANE OXT-101 produced by Toagosei Co., Ltd.) and the like.

In the present invention, in a case of using the acid generator (C2) as the crosslinking catalyst (C), an acid crosslinking agent may be used as the crosslinking agent. The acid crosslinking agent is a compound having in a molecule a plurality of reactive groups (e.g. 2-10) (for example, a carboxylic acid, a hydroxyl group, an amino group, an isocyanate group, an N-methylol group, and an alkyl-etherified N-methylol group, an epoxy group etc.) for crosslinking with the acid group, or a polyvalent metal salt of acetic acid, and is exemplified by amino resins, epoxy compounds, oxazoline compounds, aluminum acetate and the like.

The amino resins are compounds wherein a part or all of the amino groups of, for example, melamine-based compounds, guanamine-based compounds, urea-based compounds is hydroxymethylated, or compounds a part or all of the hydroxyl groups of the hydroxymethylated compounds is etherified with methanol, ethanol, n-butyl alcohol, 2-methyl-1-propanol or the like, and are exemplified by hexamethoxymethyl methylol melamine, and various amino resins of alkyl type, methylol type, imino type produced by Japan Cytec Industries, Inc. can be mentioned.

The epoxy compounds are exemplified by glycidyl ethers such as bisphenol A type epoxy resins, bisphenol F type epoxy resins, phenol novolac type epoxy resins, cresol novolac type epoxy resins, trisphenolmethane type epoxy resins, brominated epoxy resins; alicyclic epoxy resins such as 3,4-epoxycyclohexylmethyl-3,4-epoxycyclohexanecarboxylate, bis(2,3-epoxycyclopentyl)ether; glycidyl esters such as diglycidyl hexahydrophthalate, diglycidyl tetrahydrophthalate, diglycidyl phthalate; glycidyl amines such as tetraglycidyldiaminodiphenylmethane, triglycidyl p-aminophenol; heterocyclic epoxy resins such as triglycidyl isocyanurate; and the like.

As the oxazoline compounds, copolymers of polymerizable monomers such as 2-vinyl-2-oxazoline, 2-vinyl-4-methyl-2-oxazoline, 2-vinyl-5-methyl-2-oxazoline, 2-isopropenyl-2-oxazoline, 2-isopropenyl 4-methyl-2-oxazoline and so on can be mentioned.

In the present invention, the acid crosslinking agent may be used as the thermal crosslinking agent. The thermal crosslinking agent is a crosslinking agent which is blended for the purpose of improving the crosslinking of the film during the post bake. In order to improve the crosslinking density of the thermal crosslinking agent, an acid anhydride such as crotonic acid, itaconic acid, itaconic anhydride, maleic acid, maleic anhydride, fumaric acid, phthalic anhydride, tetrahydrophthalic anhydride, and cinnamic acid may be used together.

When polyfunctional thiol such as 1,4-bis(3-mercapto butyryloxy)butane and pentaerythritol tetrakis(3-mercaptobutyrate) is used together with the crosslinking agent of the present invention, the curing rate can be improved. The amount of polyfunctional thiol may be, for example, 0.1 to 20 parts by weight, for example, 1 to 10 parts by weight with respect to 100 parts by weight of the crosslinking agent.

A part or all of hydrogens of the hydrocarbon group(s) in the crosslinking agent of the present invention may be substituted with fluorine. Since non-fluorine-containing crosslinking agent is difficult to segregate to the surface compared with the fluoropolymer, the non-fluorine-containing crosslinking agent exists under the fluoropolymer and may not be crosslinked sufficiently with the fluoropolymer on the outermost surface in some cases. This may adversely affect the liquid repellency after development in some cases. By using the crosslinking agent also containing fluorine, the crosslinking agent and the fluoropolymer coexist on the surface and can be crosslinked with each other at the outermost surface, and thereby it is effective in preventing dissolution during development.

The amount of the crosslinking agent is preferably 1 to 100 parts by weight, and specifically 1 to 20 parts by weight with respect to 100 parts by weight of the fluoropolymer (A).

The resin mold and resin replica mold material composition of the present invention may be blended with, as necessary, a monomer having a fluoroalkyl group (e.g., perfluoroalkyl group) having a carbon number of 8 to 12 (e.g., fluoroalkyl (meth) acrylate such as perfluorooctyl ethyl acrylate), and a polymer composed of this monomer as a repeating unit. The monomer having a fluoroalkyl group is preferably fluoroalkyl (meth) acrylate expressed by the general formula (I) in the above, wherein a carbon number of Rf is from 8 to 12 and X is a hydrogen atom or a methyl group (X may be α-substituted).

The amount of the monomer having a fluoroalkyl group having a carbon number of 8 to 12 and the polymer may be 20 parts by weight or less, for example, 1 to 10 parts by weight, specifically from 1 to 5 parts by weight with respect to 100 parts by weight of the fluoropolymer (A).

The resin mold and resin replica mold material composition of the present invention may be blended with, as necessary, an acid scavenger to control diffusion of the acid generated from the acid generator in the film. As the acid scavenger, a basic compound is preferable, and amines (in particular, organic amines), basic ammonium salts, basic sulfonium salts, or the like are used. It is only necessary not to degrade the resist performance and sublimation. Among these acid scavengers, organic amines are preferable due to excellent imaging performance. Specific examples of the acid scavenger include 1,5-diazabicyclo[4.3.0]-5-nonene, 1,8-diazabicyclo[5.4.0]-7-undecene, 1,4-diazabicyclo[2.2.2] octane, 4-dimethylaminopyridine, 1-naphthylamine, piperidine, hexamethylenetetramine, imidazoles, hydroxy pyridines, pyridines, 4,4'-diaminodiphenyl ether, pyridinium p-toluenesulfonate, 2,4,6-trimethyl pyridinium p-toluenesulfonate, tetramethylammonium p-toluenesulfonate, tetrabutylammonium lactate, triethylamine, tributylamine, and the like. Among these, organic amines such as 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxy pyridines, pyridines, 4,4'-diaminodiphenyl ether, triethylamine, tributylamine and the like are preferable.

The amount of the acid scavenger may be 20 parts by weight or less, for example, 0.1 to 10 parts by weight, specifically 0.5 to 5 parts by weight with respect to 100 parts by weight of the acid generator (C2).

Various other additives may be used as necessary for the resin mold and resin replica mold material composition of the present invention. Such additives include, for example, fluorine-based, silicone-based, or hydrocarbon-based surfactant for improving smoothness of the mold surface; a silane coupling agent or a titanate coupling agent for improving adhesion of the mold surface to a base material; a thermal polymerization inhibitor for suppressing a dark reaction, an UV absorber, an antioxidant, an antifoamer, and so on.

The amount of these additives may be 30 parts by weight or less, for example, 0.01 to 20 parts by weight, specifically 0.1 to 10 parts by weight with respect to 100 parts by weight of a solid content of the resin mold and resin replica mold material.

The resin mold and resin replica mold material composition of the present invention can be used in any suitable manner for the resin mold and resin replica mold. For example, the resin mold and resin replica mold material composition of the present invention can be used in a manner where it is added in advance to the material for forming a resin mold and resin replica mold (and subsequently formed into a mold) (i.e., manner of use of internal addition type). Also, for example, the resin mold and resin replica mold material composition of the present invention can be used in a manner where it is applied to (for example, it coats, adheres to, or is dispersed in) a surface of a mold body of the resin mold and resin replica mold as a mold release agent composition for mold imprinting (i.e., manner of use of external addition type).

<Manufacturing Process for Resin Mold and Resin Replica Mold>

Next, a process for producing (or manufacturing) a resin mold and a resin replica mold will be described.

In the present invention, a resin mold and a resin replica mold is produced by using the fluoropolymer (A), specifically (A1) and (A2) or (A2)', for example, in the following manner.

In the present invention, firstly (i) with the use of an original mold block made of, for example, quartz, a resin replica mold is prepared by the imprinting method on a surface of a coating film the resin replica mold material composition of the present invention, and then (ii) with the use of the resin replica mold obtained above, a resin mold is prepared by the imprinting method on a surface of a coating film of the resin mold material composition of the present invention.

A process for producing a resin replica mold is firstly explained below.

<Process for Producing Resin Replica Mold>

That is, a resin replica mold of the present invention can be produced by a manufacturing process comprising steps of:

applying the resin replica mold material composition of the present invention comprising the fluoropolymer (A), specifically (A1), (A2) or (A2)' (for example, copolymer of tertiary, quaternary, quinary or senary blend system), the curable resin or monomer (B), the crosslinking catalyst (C), optionally the solvent (D), and optionally the crosslinking agent (E) on a silicon substrate or quartz or a resin substrate or a resin film to form a coating film, pressing an original mold block made of an inorganic material and formed with a fine pattern on its surface (for example, an original mold block of quartz) against the coating film to form a transferred pattern, curing the transferred pattern, and releasing a resin replica mold having the transferred pattern from the original mold block.

Preferably, the resin replica mold of the present invention can be produced by a manufacturing process comprising steps of:

applying the resin replica mold material composition of the present invention comprising the fluoropolymer (A), specifically (A1), (A2) or (A2)' (for example, copolymer of tertiary, quaternary, quinary or senary blend system), the ultraviolet curable resin or monomer (B), the photo-crosslinking catalyst (C), optionally the solvent (D), and optionally the crosslinking agent (E) on a silicon substrate or quartz or a resin substrate or a resin film to form a coating film, pressing an original mold block made of an inorganic material and formed with a fine pattern on its surface (for example, an original mold block of quartz) against the coating film to form a transferred pattern, curing the transferred pattern by exposure to ultraviolet light, and releasing a resin replica mold having the transferred pattern from the original mold block.

<Process for Producing Resin Mold>

Similarly, a resin mold of the present invention can be produced by a manufacturing process comprising the following steps of:

applying the resin mold material composition of the present invention comprising the fluoropolymer (A), specifically (A1), (A2) or (A2)' (for example, copolymer of tertiary, quaternary, quinary or senary blend system), the curable resin or monomer (B), the crosslinking catalyst (C), optionally the solvent (D), and optionally the crosslinking agent (E) on a silicon substrate or quartz or a resin substrate or a resin film to form a coating film, pressing the above-described resin replica mold formed with a fine pattern on its surface against the coating film to form a transferred pattern, curing the transferred pattern, and releasing a resin mold having the transferred pattern from the resin replica mold.

Preferably, the resin mold of the present invention can be produced by a manufacturing process comprising the following steps of:

applying the resin mold material composition of the present invention comprising the fluoropolymer (A), specifically (A1), (A2) or (A2)' (for example, copolymer of tertiary, quaternary, quinary or senary blend system), the ultraviolet curable resin or monomer (B), the photo-crosslinking catalyst (C), optionally the solvent (D), and optionally the crosslinking agent (E) on a silicon substrate or quartz or a resin substrate or a resin film to form a coating film, pressing the above-described resin replica mold formed with a fine pattern on its surface against the coating film to form a transferred pattern, curing the transferred pattern by exposure to ultraviolet light, and releasing a resin mold having the transferred pattern from the resin replica mold.

<Process for Producing (or Manufacturing) Silicon Semiconductor Substrate Formed with a Pattern>

Next, a process for producing a silicon semiconductor substrate formed with a pattern by the imprinting method using the resin mold material composition of the present invention will be described.

That is, a silicon semiconductor substrate formed with a pattern of the present invention can be produced by a manufacturing process comprising the following steps of:

applying the resin mold material composition of the present invention on a silicon substrate to form a resist layer, and pressing an original mold block made of an inorganic material or a resin mold formed with a fine pattern on its surface against the resist layer to transfer the fine pattern, curing the transferred pattern to obtain a cured resist having a fine structured pattern, releasing the original mold block made of the inorganic material or the resin mold formed with the fine pattern on its surface from the cured resist onto which the pattern is transferred, optionally subjecting the cured resist layer to oxygen asking to leave only a convex pattern in the cured resist layer, and subjecting thus obtained substrate to etching (for example, etching by fluorine-containing gas, etc.) to obtain a silicon semiconductor substrate wherein the fine structured pattern is formed on a surface of the silicon substrate.

Preferably in the present invention, the silicon semiconductor substrate can be produced by a manufacturing process comprising the following steps of:

applying the resin mold material composition on a silicon substrate to form a resist layer, and pressing an original mold block made of an inorganic material or a resin mold formed with a fine pattern on its surface against the resist layer to transfer the fine pattern, curing the transferred pattern by exposure to electromagnetic radiation to obtain a cured resist having a fine structured pattern, releasing the original mold block made of the inorganic material or the resin mold formed with the fine pattern on its surface from the cured resist onto which the pattern is transferred, optionally subjecting the cured resist layer to oxygen asking to leave only a convex pattern in the cured resist layer, and subjecting thus obtained substrate to etching (for example, etching by fluorine-containing gas) to obtain a silicon semiconductor substrate wherein the fine structured pattern is formed on a surface of the silicon substrate.

A base material for the substrate used in the present invention may be a silicon wafer, synthetic resin, glass, metal, ceramic or the like.

The synthetic resin may be either a thermoplastic resin or a thermosetting resin, and is exemplified by polyolefins such as polyethylene, polypropylene, ethylene-propylene copolymer, ethylene-vinyl acetate copolymer (EVA) and the like, cyclic polyolefins, modified polyolefins, polyvinyl chloride, polyvinylidene chloride, polystyrene, polyamide, polyimide, polyamide-imide, polycarbonate, poly-(4-methylpentene-1), ionomer, acrylic resins, polymethyl methacrylate, acryl-styrene copolymer (AS resin), butadiene-styrene copolymer, ethylene-vinyl alcohol copolymer (EVOH), polyesters such as polyethylene terephthalate (PET), polybutylene terephthalate (PBT), polycyclohexane terephthalate (PCT) and the like, polyethers, polyether ketones (PEK), polyetheretherketones (PEEK), polyetherimides, polyacetal (POM), polyphenylene oxide, modified polyphenylene oxide, polyarylate, aromatic polyesters (liquid crystal polymers), polytetrafluoroethylene, polyvinylidene fluoride, and other fluororesins, various thermoplastic elastomers such as styrene-based, polyolefin-based, polyvinyl chloride-based, polyurethane-based, fluororubber-based, and chlorinated polyethylene-based thermoplastic elastomers, epoxy resins, phenolic resins, urea resins, melamine resins, unsaturated polyesters, silicone resins, polyurethanes, and the like, and copolymers, blends, polymer alloys and the like composed mainly of these. These may be used singly, or may be used in combination of two or more (for example, in the form of a laminate of two or more layers). By using the substrate made of the synthetic resin, it is possible to provide the substrate with properties of lightweight, transparent, inexpensive, and being bendable.

As the glass, for example, silicate glass (quartz glass), alkaline silicate glass, soda-lime glass, potash-lime glass, lead (alkaline) glass, barium glass, borosilicate glass, and the like can be mentioned.

As the metal, gold, silver, copper, iron, nickel, aluminum, platinum and the like can be mentioned.

As the ceramic, oxides (e.g., aluminum oxide, zinc oxide, titanium oxide, silicon oxide, zirconia, barium titanate), nitrides (e.g., silicon nitride, boron nitride), sulfides (e.g., cadmium sulfide), carbides (e.g., silicon carbide) and the like can be mentioned, and the mixture thereof may be used.

Therefore, according to other aspect of the present invention, there is provided a manufacturing process for a structure having a patterned shape on a substrate surface, and the structure can be produced by a manufacturing process comprising the following steps of:

applying the resin mold material composition of the present invention on a substrate to form a resist layer, and pressing an original mold block made of an inorganic material or a resin mold formed with a fine pattern on its surface against the resist layer to transfer the fine pattern, curing the transferred pattern (for example, curing it by exposure to electromagnetic radiation) to obtain a cured resist having a fine structured pattern, releasing the original mold block made of the inorganic material or the resin mold formed with the fine pattern on its surface from the cured resist onto which the pattern is transferred, optionally subjecting the cured resist layer to oxygen asking to leave only a convex pattern in the cured resist layer, and subjecting thus obtained substrate to etching to obtain a structure wherein the fine structured pattern is formed on a substrate surface.

Such a substrate may be one in which any layer such as a silicon oxide layer, a silicon nitride layer, a silicon or other semiconductor layer, or a metal layer is formed on a base material of a silicon wafer, plastic, glass, metal, ceramic or the like, or may be the base material itself on which no layer is formed (e.g. a bare silicon wafer, etc.). At least a surface part of the substrate can be made of a material of being able to be etched.

Irrespective of which substrate is used, the substrate may be subjected to pretreatment such as plasma treatment or UV ozone treatment. Such pretreatment can introduce a functional group of lyophilic (for example, OH group, COOH group, NH group) to a surface of the substrate.

Oxygen ashing is carried out by exposing the cured resist layer to oxygen plasma, if required (for example, in a case where a residual film is present between the convex parts of the cured resist and shall be removed). Such oxygen plasma may be generated from oxygen gas by plasma formation, for example, with non-ionizing radiation such as visible light or microwave, etc. When the cured resist layer is exposed to oxygen plasma, the cured resist layer is decomposed and removed gradually from its exposed surface. By appropriately adjusting conditions for oxygen ashing, for example, a concentration of oxygen radicals or the like, it is possible to leave only a convex pattern in the cured resist layer. Herein, the "convex pattern in the cured resist layer" means a blank part in the fine structured pattern (transferred pattern) of the cured resist layer.

Any etching is applicable as long as a surface part of the substrate obtained as described above, which part is exposed from the cured resist layer can be etched properly. The etching may be either dry etching or wet etching, and is performed by exposing the substrate formed with the cured resist having the fine structured pattern to etching gas (plasma) and/or (wet) etchant. The etching gas and/or etchant can be appropriately selected depending on the material constituting the surface part of the substrate to be etched. For example, when the surface part is made of silicon oxide, silicon nitride, or silicon, a fluorine-containing gas, in particular fluorohydrocarbon gas such as $C_2F_4$ or $CF_4$ gas can be used. Since the cured resist layer having the file structured pattern has a higher resistance to etching (compared with oxygen ashing), the remaining part in the cured resist layer can be maintained in the form of the convex pattern. On the other hand, the surface part of the substrate which is exposed from the cured resist layer having the fine structured pattern is decomposed and removed gradually from its exposed surface when exposed to such etching gas and/or etchant, resulting in the concave shape. Conditions for etching, for example, a gas concentration and a plasma voltage of the etching gas, a concentration of the etchant or the like can be appropriately adjusted.

As understood from the above, it is possible to use the resin mold material composition of the present invention in a semiconductor lithography process using the conventional etching technique, and therefore, it becomes possible to obtain a silicon semiconductor substrate formed with the fine structured pattern or a structure having a patterned shape on its substrate surface.

Similarly, it is also possible to use the resin mold material composition of the present invention to form a thin film transistor (TFT) or a bitmap pattern media (BPM) expected as a next-generation hard disk, and the like formed by using photolithography.

It is possible to use the resin mold or the patterned substrate formed by the present invention for devices in a wide variety of applications such as electronic, optical, medical, and chemical analysis fields. For example, as to the electronic devices, it can be utilized in integrated circuit for transistor, memory, light-emitting diode (EL), laser, solar cell and so on. Furthermore, it is possible to prepare a film having a regular convexo-concave structure such as antireflection film having a moth-eye structure, solar concentrating film, liquid crystal polarizer. From these devices, flexible display, wireless tag, wearable computer and so on are produced. Furthermore, it can be utilized; as to the optical devices, in color filter for a liquid crystal display, display pixel of an organic EL, optical memory, optical modulator, optical shutter, second-order harmonic generation (SHG) device, polarizing element, photonic crystal, lens array, and so on; as to magnetic devices, in the next-generation hard disk drive (discrete track), the following next-generation hard disk drive (patterned media); as to medical devices, in biochip such as DNA array, protein array, and so on. As to the chemical analysis devices, it can be utilized in microchemical chip such as microchemical plant, microchemical analysis system, and so on.

EXAMPLES

Hereinafter, the present invention will be described specifically by way of Examples, but the present invention is not limited thereto.

A static contact angle was measured by the following procedure using an automatic contact angle meter DropMaster701 (Kyowa Interface Science Co., Ltd.) (if required, a sliding angle can also be measured).

<Measurement of Static Contact Angle of Fluoropolymer Obtained in Preparation Examples>

A 10 mass % solution in MEK of the fluoropolymer each obtained in Preparation Examples 1 to 42 described below was prepared and applied on a silicon substrate by a spin coater. Conditions of the spin coating were for 3 seconds at 300 rpm, and then for 30 seconds at 2,000 rpm. After the application, an application film was formed by heating for 1 minute at 50° C. on a hot plate. A static contact angle was determined by dropping 2 μL of n-hexadecane from a microsyringe on the substrate placed horizontally, and taking a still image one second after the dropping by a video microscope. The results obtained thereby were shown in Table 1.

<Solubility Evaluation>

The fluoropolymer each obtained in Preparation Examples 1, 3 to 10, 13, 14, 20, 24 to 32, 34, 36 and 40 was added at 2.0, 1.0 and 0.5 mass % to 5 g each of commercially available SILAPLANE FM-7711 (produced by JCN Co., Ltd.), A-TMM-3LM-N (produced by Shin-Nakamura Co., Ltd.), SUMIDUR N3300 (produced by Sumitomo Bayer Urethane Co., Ltd.), PAK-01 and PAK-02 (produced by Toyo Gosei Co., Ltd.) and stirred for 12 hours with a magnetic stirrer (the mold resins obtained by using them are referred to as mold resins 1 to 5, respectively in Table 2). The results of visual evaluation in appearance were shown in Table 2.

<Measurement of Static Contact Angle of Composition>

The composition each obtained Composition Examples 1 to 26 and Comparative Examples 1 and 2 in the preparation examples of the resin mold material (including resin replica mold material) composition described below was applied on a silicon substrate by a spin coater. Conditions of the spin coating were for 3 seconds at 300 rpm, and then for 30 seconds at 2,000 rpm. After the application, an application film was formed by heating for 1 minute at 50° C. on a hot plate. A static contact angle was determined by dropping 2 µL of n-hexadecane from a microsyringe on the substrate placed horizontally, and taking a still image one second after the dropping by a video microscope. The results obtained thereby were shown in Table 3.

<Mold Detachability Test of Composition>

The composition each obtained Composition Examples 1 to 26 and Comparative Examples 1 and 2 in the preparation examples was placed at an amount of 10 µL on a silicon substrate, and a quartz slide glass which was fluorine-coated with OPTOOL DSX (registered trademark) of a fluorinated surface treatment agent on its surface or a quartz slide glass without treatment was put thereon as a unpatterned mold so that the composition was sandwiched and spread uniformly between the silicon substrate and the slide glass (mold). This was irradiated with rays including UV light of 365 nm at an intensity of 500 mJ/cm$^2$ in a nitrogen atmosphere from the quartz glass side as the upper surface to cure the composition. The slide glass (mold) was detached (or delaminated) from the silicon substrate, so that a cured film remained on the silicon substrate. Similar procedure was repeated 50 times using the same mold and the same composition. The surface of the mold obtained was analyzed, and removal of the mold fluorine coating and adhesion of the composition to the mold were observed. The judgment of adhesion was carried out in two grades. The results obtained thereby were also shown in Table 3.

Preparation Examples of Fluoropolymer

Preparation Example 1

Rf(C4)α-Cl Acrylate/iBMA=60/40 (Weight Ratio) Copolymer

Four-necked flask equipped with a reflux condenser, a nitrogen inlet tube, a thermometer, and a stirrer was charged with 30 g of fluoroacrylate $CH_2=C(Cl)COO-CH_2CH_2C_4F_9$ [abbreviation: Rf(C4)α-Cl acrylate], 20 g of isobornyl methacrylate (abbreviated as iBMA), 3.55 g of lauryl mercaptan (abbreviated as LSH), and 100 g of 2-butanone (MEK) as a solvent, and the content was heated to 70° C. under a stream of nitrogen while being stirred. Thereto, 0.15 g of 2,2'-azobisisobutyronitrile (abbreviated as AIBN) was added, and another 0.15 g was added two hours later, polymerization was conducted for 4 hours. By analysis of Rf(C4)α-Cl acrylate monomer remaining in the reaction solution by gas chromatography, it was confirmed that the conversion rate was 95% or more. The reaction solution obtained was subjected to precipitation with methanol, and dried under vacuum to isolate a fluoropolymer. Measuring a molecular weight of thus obtained fluoropolymer by GPC, the weight-average molecular weight was 5,000.

Preparation Example 2

Rf(C4)α-Cl Acrylate/iBMA/GMA=60/30/10 (Weight Ratio) Copolymer

Four-necked flask equipped with a reflux condenser, a nitrogen inlet tube, a thermometer, and a stirrer was charged with 30 g of Rf(C4)α-Cl acrylate, 15 g of iBMA, 10 g of glycidyl methacrylate (abbreviated as GMA), 3.6 g of LSH and 100 g of MEK, and the content was heated to 70° C. under a stream of nitrogen while being stirred. Thereto, 0.16 g of 2,2'-azobisisobutyronitrile (abbreviated as AIBN) was added, and another 0.16 g was added two hours later, polymerization was conducted for 4 hours. By analysis of Rf(C4)α-Cl acrylate monomer remaining in the reaction solution by gas chromatography, it was confirmed that the conversion rate was 95% or more. The reaction solution obtained was subjected to precipitation with methanol, and dried under vacuum to isolate a fluoropolymer. Measuring a molecular weight of thus obtained fluoropolymer by GPC, the weight-average molecular weight was 6,000.

Preparation Example 3

Rf(C4)α-Cl Acrylate/iBMA/GMA/HEMA=60/30/5/5 (Weight Ratio) Copolymer

Four-necked flask equipped with a reflux condenser, a nitrogen inlet tube, a thermometer, and a stirrer was charged with 30 g of Rf(C4)α-Cl acrylate, 15 g of iBMA, 2.5 g of GMA, 2.5 g of HEMA., 3.6 g of LSH and 100 g of MEK, and the content was heated to 70° C. under a stream of nitrogen while being stirred. Thereto, 0.15 g of 2,2'-azobisisobutyronitrile (abbreviated as AIBN) was added, and another 0.15 g was added two hours later, polymerization was conducted for 4 hours. By analysis of Rf(C4)α-Cl acrylate monomer remaining in the reaction solution by gas chromatography, it was confirmed that the conversion rate was 95% or more. The reaction solution obtained was subjected to precipitation with methanol, and dried under vacuum to isolate a fluoropolymer. Measuring a molecular weight of thus obtained fluoropolymer by GPC, the weight-average molecular weight was 5,400.

Preparation Examples 4 to 7

As shown in Table 1, Preparation Examples 4 to 7 were conducted in the same manner as in Preparation Examples 1 to 3 except for changing the ratio of each monomer in Preparation Examples 1 to 3. LSH and AIBN were mixed at 10% by mole and 1% by mole, respectively (both with respect to monomer concentration). The composition of thus obtained polymers was shown in Table 1 together with the results of Preparation Examples 1 to 3.

Preparation Examples 8 to 11

As shown in Table 1, Preparation Examples 8 to 11 were conducted in the same manner as in Preparation Examples 1 to 7 except for substituting iBMA in Preparation Examples 1 to 7 with SILAPLANE TM-0701T (silicone macropolymer methacrylate, produced by JCN Co., Ltd.) as a reactive silicone (meth) acrylate. LSH and AIBN were mixed at 10% by mole and 1% by mole, respectively (both with respect to monomer concentration). The composition of the polymers in Preparation Examples 8 to 11 was shown in Table 1.

Preparation Examples 12 to 14

As shown in Table 1, Preparation Examples 12 to 14 were conducted in the same manner as in Preparation Examples 1 to 7 except for substituting iBMA in Preparation Examples 1 to 7 with (triisopropoxysilyl) propyl methacrylate (also known as 3-(meth)acryloyloxypropyl triisopropoxy silane, abbreviated as TISMA) as a mono-terminal type (meth) acrylic based SiO-containing monomer. LSH and AIBN were mixed at 10% by mole and 1% by mole, respectively (both with respect to monomer concentration). The composition of the polymers in Preparation Examples 12 to 14 was shown in Table 1.

Preparation Examples 15 to 21

As shown in Table 1, Preparation Examples 15 to 21 were conducted in the same manner as in Preparation Examples 1 to 7 except for substituting Rf(C4)α-Cl acrylate in Preparation Examples 1 to 7 with perfluorohexyl methacrylate (abbreviated as Rf(C6) methacrylate). LSH and AIBN were mixed at 10% by mole and 1% by mole, respectively (both with respect to monomer concentration). The composition of the polymers in Preparation Examples 15 to 21 was shown in Table 1.

Preparation Examples 22 to 25

As shown in Table 1, Preparation Examples 22 to 25 were conducted in the same manner as in Preparation Example 1 except for substituting iBMA in Preparation Example 1 with benzyl methacrylate (abbreviated as BzMA) and changing the monomer ratios as shown in Table 1. LSH and AIBN were mixed at 10% by mole and 1% by mole, respectively (both with respect to monomer concentration). The composition of the polymers in Preparation Examples 22 to 25 was shown in Table 1.

Preparation Example 26

As shown in Table 1, Preparation Example 26 was conducted in the same manner as in Preparation Example 1 except for substituting iBMA in Preparation Example 1 with polyethylene glycol methacrylate (abbreviated as PEGMA) having a side chain molecular weight of 350 (hereinafter expressed as Mw=350) and changing the monomer ratios as shown in Table 1. LSH and AIBN were mixed at 10% by mole and 1% by mole, respectively (both with respect to monomer concentration). The composition of the polymers in Preparation Example 26 was shown in Table 1.

Preparation Example 27

As shown in Table 1, Preparation Example 27 was conducted in the same manner as in Preparation Example 1 except for substituting iBMA in Preparation Example 1 with PEGMA (Mw=350) and BzMA and changing the monomer ratios as shown in Table 1. LSH and AIBN were mixed at 10% by mole and 1% by mole, respectively (both with respect to monomer concentration). The composition of the polymers in Preparation Example 27 was shown in Table 1.

Preparation Examples 28 to 30

As shown in Table 1, Preparation Example 26 was conducted in the same manner as in Preparation Example 1 except for substituting iBMA in Preparation Example 1 with PEGMA (Mw=350) and polypropylene glycol methacrylate (abbreviated as PPGMA) having a side chain molecular weight of 350, 630, 910 (hereinafter expressed as Mw=350, 630, 910) and changing the monomer ratios as shown in Table 1. LSH and AIBN were mixed at 10% by mole and 1% by mole, respectively (both with respect to monomer concentration). The composition of the polymers in Preparation Examples 28 to 30 was shown in Table 1.

Preparation Example 31

As shown in Table 1, Preparation Example 31 was conducted in the same manner as in Preparation Example 1 except for substituting iBMA in Preparation Example 1 with polyethylene glycol-polypropylene glycol block copolymer methacrylate (abbreviated as PEGm+PPGnMA) having an average side chain molecular number of m=3.5 and n=2.5 and changing the monomer ratios as shown in Table 1. LSH and AIBN were mixed at 10% by mole and 1% by mole, respectively (both with respect to monomer concentration). The composition of the polymers in Preparation Example 31 was shown in Table 1.

Preparation Example 32

As shown in Table 1, Preparation Example 32 was conducted in the same manner as in Preparation Example 1 except for substituting PEGMA (Mw=350) in Preparation Example 26 with PEGMA (Mw=200) and changing the monomer ratios as shown in Table 1. LSH and AIBN were mixed at 10% by mole and 1% by mole, respectively (both with respect to monomer concentration). The composition of the polymers in Preparation Example 32 was shown in Table 1.

Preparation Examples 33 to 42

As shown in Table 1, Preparation Examples 33 to 42 were conducted in the same manner as in Preparation Examples 1, 22 to 26, 28 to 30 except for substituting Rf(C4)α-Cl acrylate in Preparation Examples 1, 22 to 26, 28 to 30 with perfluorohexylethyl α-chloro acrylate (abbreviated as Rf(C6) α-Cl acrylate). LSH and AIBN were mixed at 10% by mole and 1% by mole, respectively (both with respect to monomer concentration). The composition of the polymers in Preparation Examples 33 to 42 was shown in Table 1.

<Composition of Prepared Fluoropolymers and Measurement Results of Static Contact Angle (Table 1)>

TABLE 1

| Preparation Example | Polymer Composition (mass %) | | | | | | | | |
|---|---|---|---|---|---|---|---|---|---|
| | Rf(C4) α-Cl acrylate | Rf(C6) methacrylate | Ff(C6) α-Cl acrylate | iBMA | Silicone macropolymer methacrylate | TISMA | GMA | HEMA | PEGMA (Mw = 350) |
| 1 | 60 | | | 40 | | | | | |
| 2 | 60 | | | 30 | | | 10 | | |
| 3 | 60 | | | 30 | | | 5 | 5 | |
| 4 | 45 | | | 55 | | | | | |
| 5 | 45 | | | 45 | | | 10 | | |
| 6 | 45 | | | 45 | | | 5 | 5 | |
| 7 | 30 | | | 70 | | | | | |
| 8 | 60 | | | | 40 | | | | |
| 9 | 45 | | | | 55 | | | | |
| 10 | 30 | | | | 70 | | | | |
| 11 | 30 | | | | 60 | | 10 | | |
| 12 | 60 | | | | | 40 | | | |
| 13 | 45 | | | | | 55 | | | |
| 14 | 30 | | | | | 70 | | | |
| 15 | | 60 | | 40 | | | | | |
| 16 | | 60 | | 30 | | | 10 | | |
| 17 | | 60 | | 30 | | | 5 | 5 | |
| 18 | | 45 | | 55 | | | | | |
| 19 | | 45 | | 45 | | | 10 | | |
| 20 | | 30 | | 70 | | | | | |
| 21 | | 30 | | 60 | | | 10 | | |
| 22 | 60 | | | | | | | | |
| 23 | 50 | | | | | | | | |
| 24 | 40 | | | | | | | | |
| 25 | 30 | | | | | | | | |
| 26 | 40 | | | | | | | | 60 |
| 27 | 40 | | | | | | | | 30 |
| 28 | 40 | | | | | | | | 30 |
| 29 | 40 | | | | | | | | 30 |
| 30 | 40 | | | | | | | | 30 |
| 31 | 40 | | | | | | | | |
| 32 | 30 | | | | | | | | 35 (Mw = 200) |
| 33 | | | 60 | 40 | | | | | |
| 34 | | | 45 | 55 | | | | | |
| 35 | | | 60 | | | | | | |
| 36 | | | 45 | | | | | | |
| 37 | | | 60 | | | | | | 40 |
| 38 | | | 45 | | | | | | 55 |
| 39 | | | 60 | | | | | | 20 |
| 40 | | | 40 | | | | | | 30 |
| 41 | | | 40 | | | | | | 30 |
| 42 | | | 40 | | | | | | 30 |

| Preparation Example | Polymer Composition (mass %) | | | LSH (with respect to monomer concentration) | Mold releasability: n-hexadecane Static contact angle |
|---|---|---|---|---|---|
| | BzMA | PPGMA | PEGm + PPGnMA | | |
| 1 | | | | 10 | 64 |
| 2 | | | | 10 | 62 |
| 3 | | | | 10 | 61 |
| 4 | | | | 10 | 62 |
| 5 | | | | 10 | 61 |
| 6 | | | | 10 | 59 |
| 7 | | | | 10 | 60 |
| 8 | | | | 10 | 63 |
| 9 | | | | 10 | 61 |
| 10 | | | | 10 | 59 |
| 11 | | | | 10 | 59 |
| 12 | | | | 10 | 65 |
| 13 | | | | 10 | 63 |
| 14 | | | | 10 | 61 |

TABLE 1-continued

| Prep. Ex. | col A | col B | col C | col D | col E |
|---|---|---|---|---|---|
| 15 | | | | 10 | 68 |
| 16 | | | | 10 | 65 |
| 17 | | | | 10 | 64 |
| 18 | | | | 10 | 65 |
| 19 | | | | 10 | 63 |
| 20 | | | | 10 | 63 |
| 21 | | | | 10 | 63 |
| 22 | 40 | | | 10 | 65 |
| 23 | 50 | | | 10 | 64 |
| 24 | 60 | | | 10 | 62 |
| 25 | 70 | | | 10 | 61 |
| 26 | | | | 10 | <40 |
| 27 | 30 | | | 10 | 56 |
| 28 | | 30 (Mw = 350) | | 10 | <40 |
| 29 | | 30 (Mw = 630) | | 10 | <40 |
| 30 | | 30 (Mw = 910) | | 10 | <40 |
| 31 | | | 60 m = 3.5, n = 2.5 | 10 | <40 |
| 32 | 35 | | | 10 | <40 |
| 33 | | | | 10 | 69 |
| 34 | | | | 10 | 67 |
| 35 | 40 | | | 10 | 71 |
| 36 | 55 | | | 10 | 68 |
| 37 | | | | 10 | <40 |
| 38 | | | | 10 | <40 |
| 39 | | 20 (Mw = 350) | | 10 | <40 |
| 40 | | 30 (Mw = 350) | | 10 | <40 |
| 41 | | 30 (Mw = 630) | | 10 | <40 |
| 42 | | 30 (Mw = 910) | | 10 | <40 |

Abbreviations etc. in Table 1:
mass %: it means a percent by weight of each of copolymer components in the polymer
Silicone macropolymer methacrylate: SILAPLANE TM-0701T (JCN Co., Ltd.)
iBMA: isobornyl methacrylate
GMA: glycidyl methacrylate
HEMA: 2-hydroxyethyl methacrylate
TISMA: (triisopropoxysilyl) propyl methacrylate
PEGMA: polyethylene glycol methacrylate
BzMA: benzyl methacrylate
PPGMA: polypropylene glycol methacrylate
PEGm + PPGnMA: polyethylene glycol-polypropylene glycol block copolymer methacrylate
LSH: lauryl mercaptan <Results in Solubility Evaluation of Prepared Fluoropolymers (Table 2)>

TABLE 2

| Preparation Example | Additive amount (mass %) | Mold resin 1 | 2 | 3 | 4 | 5 |
|---|---|---|---|---|---|---|
| 1 | 2 | X | X | X | X | X |
|   | 1 | X | X | ○ | X | △ |
|   | 0.5 | △ | X | ○ | △ | ○ |
| 3 | 2 | X | X | X | X | X |
|   | 1 | X | X | X | X | X |
|   | 0.5 | X | ○ | ○ | X | △ |
| 4 | 2 | X | X | X | X | X |
|   | 1 | ○ | △ | △ | △ | ○ |
|   | 0.5 | ○ | △ | △ | ○ | ○ |
| 5 | 2 | X | X | X | X | X |
|   | 1 | X | X | X | △ | △ |
|   | 0.5 | △ | △ | △ | ○ | ○ |
| 6 | 2 | X | X | X | X | X |
|   | 1 | X | △ | △ | X | △ |
|   | 0.5 | △ | △ | △ | ○ | ○ |
| 7 | 2 | X | X | X | X | ○ |
|   | 1 | ○ | △ | X | △ | ○ |
|   | 0.5 | ○ | ○ | △ | ○ | ○ |
| 8 | 2 | X | X | X | X | X |
|   | 1 | ○ | X | X | ○ | △ |
|   | 0.5 | ○ | △ | ○ | ○ | ○ |
| 9 | 2 | X | X | X | X | X |
|   | 1 | ○ | X | X | X | △ |
|   | 0.5 | ○ | X | X | △ | ○ |
| 10 | 2 | X | X | X | X | X |
|    | 1 | ○ | X | X | X | △ |
|    | 0.5 | ○ | △ | △ | △ | ○ |
| 13 | 2 | X | X | X | X | X |
|    | 1 | ○ | X | X | ○ | ○ |
|    | 0.5 | ○ | △ | △ | ○ | ○ |
| 14 | 2 | ○ | X | X | X | X |
|    | 1 | ○ | X | X | ○ | ○ |
|    | 0.5 | ○ | ○ | △ | ○ | ○ |
| 20 | 2 | X | X | X | X | X |
|    | 1 | X | X | X | X | △ |
|    | 0.5 | △ | X | △ | △ | ○ |
| 24 | 2 | ○ | ○ | X | ○ | ○ |
|    | 1 | ○ | ○ | X | ○ | ○ |
|    | 0.5 | ○ | ○ | △ | ○ | ○ |

TABLE 2-continued

| Preparation Example | Addtive amount (mass %) | Mold resin 1 | 2 | 3 | 4 | 5 |
|---|---|---|---|---|---|---|
| 25 | 2 | ○ | ○ | X | ○ | ○ |
|  | 1 | ○ | ○ | X | ○ | ○ |
|  | 0.5 | ○ | ○ | Δ | ○ | ○ |
| 26 | 2 | X | X | X | X | X |
|  | 1 | ○ | X | X | X | ○ |
|  | 0.5 | Δ | Δ | X | Δ | ○ |
| 27 | 2 | ○ | ○ | ○ | ○ | ○ |
|  | 1 | ○ | Δ | Δ | ○ | ○ |
|  | 0.5 | ○ | Δ | Δ | ○ | ○ |
| 28 | 2 | ○ | X | ○ | ○ | ○ |
|  | 1 | ○ | Δ | Δ | ○ | ○ |
|  | 0.5 | ○ | Δ | Δ | ○ | ○ |
| 29 | 2 | ○ | ○ | ○ | ○ | ○ |
|  | 1 | ○ | ○ | ○ | ○ | ○ |
|  | 0.5 | ○ | ○ | ○ | ○ | ○ |
| 30 | 2 | ○ | ○ | ○ | ○ | ○ |
|  | 1 | ○ | ○ | ○ | ○ | ○ |
|  | 0.5 | ○ | ○ | ○ | ○ | ○ |
| 31 | 2 | ○ | ○ | X | ○ | ○ |
|  | 1 | ○ | ○ | X | ○ | ○ |
|  | 0.5 | ○ | ○ | Δ | ○ | ○ |
| 32 | 2 | X | X | X | X | X |
|  | 1 | X | Δ | Δ | Δ | Δ |
|  | 0.5 | Δ | Δ | Δ | ○ | ○ |
| 34 | 2 | X | X | X | X | Δ |
|  | 1 | Δ | ○ | X | ○ | ○ |
|  | 0.5 | ○ | ○ | Δ | ○ | ○ |
| 36 | 2 | X | X | X | X | ○ |
|  | 1 | ○ | ○ | X | Δ | ○ |
|  | 0.5 | ○ | ○ | Δ | ○ | ○ |
| 40 | 2 | ○ | ○ | ○ | ○ | ○ |
|  | 1 | ○ | ○ | ○ | ○ | ○ |
|  | 0.5 | ○ | ○ | ○ | ○ | ○ |

Evaluation index for solubility in Table 2:
○: dissolved
Δ: white turbid
X: insoluble Preparation Examples of Resin Mold Material (Including Resin Replica Mold Material) Composition Composition Example 1

Composition Example 1 was prepared by dissolving 30 mg of the copolymer (0.5 mass % with respect to mold resin) in Preparation Example 1 into 6.0 g of PAK-02 (produced by Toyo Gosei Co., Ltd.), adding 120 mg of IRGACURE 907 (produced by Ciba Specialty Co., Ltd.) as a photo initiator (2.0 mass % with respect to mold resin) thereto, stirring it for 12 hours by a rotary mill while being shielded from light.

Composition Examples 2 to 9, 15 to 26

Composition Examples 2 to 9, 15 to 26 were prepared in the same manner as in Composition Example 1 except for adding the copolymer in Preparation Examples 3, 4, 5, 7, 9, 10, 13, 20, 24 to 32, 34, 36, 40 at an amount shown in Table 3, instead of the copolymer in Production Example 1.

Composition Example 10

Composition Example 10 was prepared by dissolving 30 mg of the copolymer (0.5 mass % with respect to mold resin) in Preparation Example 4 into 6.0 g of PAK-01 (produced by Toyo Gosei Co., Ltd.), adding 120 mg of IRGACURE 907 (produced by Ciba Specialty Co., Ltd.) as a photo initiator (2.0 mass % with respect to mold resin) thereto, stirring it for 12 hours by a rotary mixer while being shielded from light.

Composition Examples 11 to 14

Composition Examples 11 to 14 were prepared in the same manner as in Composition Example 10 except for adding the copolymer in Preparation Examples 5, 7, 13 and 14 at an amount shown in Table 3, instead of the copolymer in Production Example 4.

Comparative Example 1

Comparative Example 1 was conducted by adding 120 mg of IRGACURE 907 (produced by Ciba Specialty Co., Ltd.) as a photo initiator (2.0 mass % with respect to mold resin) to 6.0 g of PAK-02 (produced by Toyo Gosei Co., Ltd.), and stirring it for 12 hours by a rotary mixer while being shielded from light.

Comparative Example 2

Comparative Example 2 was conducted in the same manner as in Comparative Example 1 except for substituting PAK-02 (produced by Toyo Gosei Co., Ltd.) with PAK-01 (produced by Toyo Gosei Co., Ltd.).

Results in Releasability Evaluation of Composition Examples (Table 3)

TABLE 3

| | | | | Mold releasabilty evaluation | | |
|---|---|---|---|---|---|---|
| | Mold release agent | | | | Adhesive | Adhesive |
| Composition Example | Preparation Example | Additive amount (mass %) | Static contact angle (n-hexadecane) | Removal of Mold fluorine coating | matter to Fluorocated mold | matter to Untreated mold |
| 1 | 1 | 0.5 | 52 | A | a | a |
| 2 | 3 | 0.5 | 48 | A | a | a |
| 3 | 4 | 1.0 | 56 | A | a | b |
| 4 | 5 | 0.5 | 46 | A | a | b |
| 5 | 7 | 2.0 | 55 | A | a | a |
| 6 | 9 | 0.5 | 43 | A | a | b |
| 7 | 10 | 1.0 | 54 | A | a | b |
| 8 | 13 | 1.0 | 61 | A | a | b |
| 9 | 20 | 0.5 | 52 | A | a | a |
| 10 | 4 | 0.5 | 48 | A | a | a |
| 11 | 5 | 0.5 | 47 | A | a | a |

TABLE 3-continued

| | Mold release agent | | Mold releasabilty evaluation | | | |
|---|---|---|---|---|---|---|
| | | | | | Adhesive | Adhesive |
| Composition Example | Preparation Example | Additive amount (mass %) | Static contact angle (n-hexadecane) | Removal of Mold fluorine coating | matter to Fluorocated mold | matter to Untreated mold |
| 12 | 7 | 0.5 | 43 | A | a | a |
| 13 | 13 | 1.0 | 59 | A | a | b |
| 14 | 14 | 1.0 | 54 | A | a | a |
| 15 | 24 | 2.0 | 63 | A | a | a |
| 16 | 25 | 2.0 | 60 | A | a | a |
| 17 | 26 | 2.0 | <40 | A | a | a |
| 18 | 27 | 2.0 | 53 | A | a | a |
| 19 | 28 | 2.0 | <40 | A | a | a |
| 20 | 29 | 2.0 | <40 | A | a | a |
| 21 | 30 | 2.0 | <40 | A | a | a |
| 22 | 31 | 2.0 | <40 | A | a | a |
| 23 | 32 | 1.0 | <40 | A | a | a |
| 24 | 34 | 1.0 | 61 | A | a | a |
| 25 | 36 | 2.0 | 67 | A | a | a |
| 26 | 40 | 2.0 | <40 | A | a | a |
| Comparative Example 1 | — | — | 26 | A | b | b |
| Comparative Example 2 | — | — | 18 | A | b | b |

Evaluation index for detachability in Table 3:
Degree of removal of the mold fluorine coating layer:
A: removal of the mold fluorine coating was observed;
B removal of the mold fluorine coating was not observed.
Degree of adhesion of the composition to the mold:
a: adhesion of the composition to the mold was observed;
b: adhesion of the composition to the mold was not observed.

INDUSTRIAL APPLICABILITY

A resin mold material and resin replica mold material composition according to the present invention, and a resin mold and a resin replica mold comprising the material composition have not only a superior mold releasability, but also an advantage in terms of cost, and therefore they can be used as a resin mold and a resin replica mold for imprinting, for example, in the production of semiconductor substrates with highly definition.

The invention claimed is:

1. A resin mold material composition for imprinting which comprises 0.1 to 10 parts by weight of a curable fluoropolymer (A) with respect to 100 parts by weight of a curable resin or curable monomer which is able to form a mold resin or a replica mold resin for imprinting,
    wherein the curable fluoropolymer (A) comprises as a repeating unit:
    (a1) an α-position substituted acrylate having a fluoroalkyl group with a carbon number of 4 to 6
    wherein a substituent group at the α-position is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20; and
    the curable fluoropolymer (A) has a weight-average molecular weight of 3,000 to 20,000.

2. The material composition according to claim 1, wherein the fluoroalkyl group is a perfluoroalkyl group with a carbon number of 4.

3. The material composition according to claim 1, which is a mold release agent composition for a mold imprinting.

4. The material composition according to claim 1, which comprises the fluoropolymer (A); the curable resin or monomer (B); a crosslinking catalyst (C); optionally a solvent (D); and optionally a crosslinking agent (E).

5. The material composition according to claim 4, wherein the curable resin or monomer (B) is an ultraviolet curable resin or monomer (B), and the crosslinking catalyst (C) is a photo-crosslinking catalyst (C).

6. A manufacturing process for a resin replica mold, which comprises steps of:
    applying the material composition according to claim 1 on a silicon substrate or quartz or a resin substrate or a resin film to form a coating film,
    pressing an original mold block made of an inorganic material and formed with a fine pattern on its surface against the coating film to form a transferred pattern,
    curing the transferred pattern, and
    releasing a resin replica mold having the transferred pattern from the original mold block.

7. The manufacturing process according to claim 6, wherein the step of curing the transferred pattern is curing by exposure to ultraviolet light.

8. A manufacturing process for a resin mold, which comprises steps of:
    applying the material composition according to claim 1 on a silicon substrate or quartz or a resin substrate or a resin film to form a coating film,
    pressing a resin replica mold formed with a fine pattern on its surface against the coating film to form a transferred pattern,
    curing the transferred pattern, and
    releasing a resin mold having the transferred pattern from the resin replica mold.

9. The manufacturing process according to claim 8, wherein the step of curing the transferred pattern is curing by exposure to ultraviolet light.

10. A manufacturing process for a silicon semiconductor substrate formed with a pattern, which comprises steps of:
applying the material composition according to claim 1 on a silicon substrate to form a resist layer, and pressing an original mold block made of an inorganic material or a resin mold formed with a fine pattern on its surface against the resist layer to transfer the fine pattern,
curing the transferred pattern to obtain a cured resist having a fine structured pattern,
releasing the original mold block made of the inorganic material or the resin mold formed with the fine pattern on its surface from the cured resist onto which the pattern is transferred,
optionally subjecting the cured resist layer to oxygen ashing to leave only a convex pattern in the cured resist layer, and
subjecting thus obtained substrate to etching to obtain a silicon semiconductor substrate wherein the fine structured pattern is formed on a surface of the silicon substrate.

11. The manufacturing process according to claim 10, wherein the step of curing the transferred pattern to obtain a cured resist having a fine structured pattern is curing by exposure to electromagnetic radiation to obtain the cured resist having the fine structured pattern.

12. A manufacturing process for a structure having a patterned shape on a substrate surface, which comprises steps of:
applying the material composition according to claim 1 on a substrate to form a resist layer, and pressing an original mold block made of an inorganic material or a resin mold formed with a fine pattern on its surface against the resist layer to transfer the fine pattern,
curing the transferred pattern to obtain a cured resist having a fine structured pattern,
releasing the original mold block made of the inorganic material or the resin mold formed with the fine pattern on its surface from the cured resist onto which the pattern is transferred,
optionally subjecting the cured resist layer to oxygen ashing to leave only a convex pattern in the cured resist layer, and
subjecting thus obtained substrate to etching to obtain a structure wherein the fine structured pattern is formed on a substrate surface.

13. The manufacturing process according to claim 12, wherein the step of curing the transferred pattern to obtain a cured resist having a fine structured pattern is curing by exposure to electromagnetic radiation to obtain the cured resist having the fine structured pattern.

14. The material composition according to claim 1, wherein the curable fluoropolymer (A) corresponds to a fluoropolymer (A2) which comprises as repeating units:
(a1) an α-position substituted acrylate having a fluoroalkyl group with a carbon number of 4 to 6, at 100 parts by weight
wherein a substituent group at the α-position is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20,
(a3-1) a crosslinking group-containing monomer containing an epoxy group at 5 to 60 parts by weight, and
(a5) an alkyleneoxy group-containing monomer represented by a formula $(R^1O)_nR^2$ (wherein $R^1$ is —$(CH_2)_2$— or —$(CH_2)_3$—, $R^2$ is hydrogen or a methyl group, and n is 1 to 10) at 10 to 40 parts by weight; and
the fluoropolymer (A2) has a weight-average molecular weight of 3,000 to 20,000.

15. The material composition according claim 14, wherein the fluoropolymer (A2) further comprises as a repeating unit
(a4) an SiO-containing monomer at 2 to 20 parts by weight.

16. The material composition according to claim 14, wherein a hydroxyl group at a terminal of (a5) the alkyleneoxy group-containing monomer of the fluoropolymer (A2) is reacted with an isocyanate group-containing unsaturated compound.

17. The material composition according to claim 14 wherein the fluoroalkyl group is a perfluoroalkyl group with a carbon number of 4.

18. The material composition according to claim 1, wherein the curable fluoropolymer (A) corresponds to a fluoropolymer (A2)' which comprises as repeating units:
(a1) an α-position substituted acrylate having a fluoroalkyl group with a carbon number of 4 to 6, at 100 parts by weight
wherein a substituent group at the α-position is a fluorine atom, a chlorine atom, a bromine atom, an iodine atom, a $CFX^1X^2$ group (wherein $X^1$ and $X^2$ are a hydrogen atom, a fluorine atom, a chlorine atom, a bromine atom or an iodine atom), a cyano group, a linear or branched fluoroalkyl group with a carbon number of 1 to 20, a substituted or unsubstituted benzyl group, a substituted or unsubstituted phenyl group, or a linear or branched alkyl group with a carbon number of 1 to 20,
(a5) an alkyleneoxy group-containing monomer represented by a formula $(R^1O)_nR^2$ (wherein $R^1$ is —$(CH_2)_2$— or —$(CH_2)_3$—, $R^2$ is hydrogen or a methyl group, and n is 1 to 10) at 55 to 300 parts by weight, and
if present, (a2) a high-softening-point monomer which exhibits a softening point or glass transition point of at least 50° C. in a state of homopolymer, at 5 to 120 parts by weight; and
the fluoropolymer (A2)' has a weight-average molecular weight of 3,000 to 20,000.

19. The material composition according claim 18, wherein the fluoropolymer (A2)' further comprises as a repeating unit
(a4) an SiO-containing monomer at 2 to 20 parts by weight.

20. The material composition according to claim 18, wherein a hydroxyl group at a terminal of (a5) the alkyleneoxy group-containing monomer of the fluoropolymer (A2)' is reacted with an isocyanate group-containing unsaturated compound.

21. The material composition according to claim 18, wherein the fluoroalkyl group is a perfluoroalkyl group with a carbon number of 4.

22. The material composition according to claim 1, wherein the curable fluoropolymer (A) corresponds to a fluoropolymer (A1) which further comprises as a repeating unit:

(a2) a high-softening-point monomer which exhibits a softening point or glass transition point of at least 50° C. in a state of homopolymer, at 5 to 120 parts by weight; and the fluoropolymer (A1) has a weight-average molecular weight of 3,000 to 20,000.

23. The material composition according to claim 22, wherein the high-softening-point monomer (a2) is a monomer which exhibits a glass transition point or melting point of at least 100° C. in a state of homopolymer.

24. The material composition according to claim 22, wherein the high-softening-point monomer (a2) is a (meth) acrylate monomer represented by a formula:

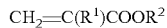

wherein $R^1$ is H or $CH_3$, $R^2$ is a saturated alkyl group with a carbon number of 4 to 20 and a ratio of carbon atoms to hydrogen atoms of 0.58 or more.

25. The material composition according to claim 22, wherein the fluoropolymer (A1) further comprises as repeating units:
(a3-1) a crosslinking group-containing monomer containing an epoxy group at 5 to 30 parts by weight, and
(a4) an SiO-containing monomer at 2 to 20 parts by weight.

26. The material composition according to claim 22, wherein the high-softening-point monomer (a2) is a cyclic hydrocarbon group-containing (meth) acrylate and/or an SiO-containing monomer (a4).

27. The material composition according to claim 26, wherein the SiO-containing monomer (a4) is a silicone (meth) acrylate and/or an alkoxysilane group-containing (meth) acrylate.

28. The material composition according to claim 22, wherein the fluoropolymer (A1) further comprises as a repeating unit:
(a3) a crosslinking group-containing monomer containing one or both of an epoxy group (a3-1) and a hydroxyl group (a3-2), at 5 to 30 parts by weight.

29. The material composition according to claim 28, wherein the epoxy group of the fluoropolymer (A1) is reacted with an unsaturated organic acid.

30. The material composition according to claim 28, wherein the hydroxyl group of the fluoropolymer (A1) is reacted with an isocyanate group-containing unsaturated compound.

* * * * *